(12) United States Patent  
Germano et al.

(10) Patent No.: US 12,525,457 B2  
(45) Date of Patent: Jan. 13, 2026

(54) SURFACE PROCESSING OF SEMICONDUCTOR WORKPIECES

(71) Applicant: Wolfspeed, Inc., Durham, NC (US)

(72) Inventors: Nolan David Germano, Raleigh, NC (US); Emma Elizabeth Stone, Durham, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/734,796

(22) Filed: Jun. 5, 2024

(65) Prior Publication Data

US 2025/0379058 A1   Dec. 11, 2025

(51) Int. Cl.
| | | |
|---|---|---|
| *H01L 21/304* | (2006.01) | |
| *B24B 49/03* | (2006.01) | |
| *B24B 49/05* | (2006.01) | |
| *H01L 21/66* | (2006.01) | |

(52) U.S. Cl.
CPC .......... *H01L 21/304* (2013.01); *B24B 49/03* (2013.01); *B24B 49/05* (2013.01); *H01L 22/12* (2013.01); *H01L 2221/68331* (2013.01)

(58) Field of Classification Search
CPC . H01L 22/12; H01L 21/304; H01L 21/02013; H01L 21/7806; B24B 55/03; B24B 7/228; B24B 37/042; B24B 49/04
See application file for complete search history.

(56) References Cited

U.S. PATENT DOCUMENTS

| | | | |
|---|---|---|---|
| 7,077,726 B2 * | 7/2006 | Pietsch | H01L 21/02008 |
| | | | 451/41 |
| 10,576,585 B1 | 3/2020 | Donofrio et al. | |
| 11,219,966 B1 | 1/2022 | Donofrio et al. | |
| 11,654,596 B2 | 5/2023 | Bubel et al. | |
| 11,901,181 B2 | 2/2024 | Donofrio et al. | |
| 11,971,365 B2 | 4/2024 | Wang et al. | |
| 2005/0020185 A1 | 1/2005 | Zuniga et al. | |
| 2012/0048083 A1 * | 3/2012 | Schwerdtfeger | C30B 11/002 |
| | | | 117/13 |

(Continued)

FOREIGN PATENT DOCUMENTS

| | | |
|---|---|---|
| CN | 110193775 B | 9/2021 |
| CN | 114227525 A | 3/2022 |
| KR | 20080113708 A | 12/2008 |

OTHER PUBLICATIONS

Disco, "Chemical-Free Stress Relief Dry Polishing Wheel", DP08 Series Product Information, https://www.discousa.com/eg/products/dry_wheel/dp08.html, retrieved on Mar. 7, 2024, 3 pages.

(Continued)

*Primary Examiner* — Makena S Markman
(74) *Attorney, Agent, or Firm* — Dority & Manning, P.A.

(57) ABSTRACT

An example method includes obtaining data indicative of a workpiece processing parameter. In some implementations, the example method includes determining a grinding depth for a semiconductor workpiece based at least in part on the data indicative of the workpiece processing parameter. In some implementations, the example method includes performing a grinding operation to remove material from the semiconductor workpiece to reduce a thickness of the semiconductor workpiece by the grinding depth.

10 Claims, 16 Drawing Sheets

(56) References Cited

U.S. PATENT DOCUMENTS

| | | | |
|---|---|---|---|
| 2015/0303049 A1* | 10/2015 | Tanaka | B28D 5/045 |
| | | | 451/41 |
| 2015/0348797 A1 | 12/2015 | Hui et al. | |
| 2020/0051235 A1* | 2/2020 | Majumdar | G01N 21/211 |
| 2022/0126395 A1* | 4/2022 | Donofrio | C30B 33/06 |
| 2022/0410305 A1* | 12/2022 | Genda | G01N 21/9501 |
| 2023/0178358 A1* | 6/2023 | Nagami | H01L 21/67132 |
| | | | 451/69 |
| 2023/0178359 A1* | 6/2023 | Fukushi | B23K 26/03 |
| | | | 156/702 |
| 2024/0133077 A1* | 4/2024 | Johnson, II | C30B 29/66 |
| 2024/0326174 A1* | 10/2024 | Yasuda | H01L 21/67092 |

OTHER PUBLICATIONS

Rena, "ACE Advanced Electrochemical Etching for SiC-Wafers", https://www.rena.com/en/technology/innovations/sic-electrochemical-etching, retrieved on Mar. 7, 2024, 5 pages.

Son et al., "Contact-Area-Changeable CMP Conditioning for Enhancing Pad Lifetime", Applied Sciences MDPI, vol. 11, No. 3521, Apr. 14, 2021, pp. 1-15.

Zhu et al., "Grinding Marks in Back Grinding of Wafer with Outer Rim", Institute of Mechanical Engineers, Journal of Mechanical Engineering Science, Jan. 27, 2020, pp. 1-12.

International Search Report and Written Opinion for Application No. PCT/US2025/032412, mailed Dec. 5, 2025, 17 pages.

\* cited by examiner

SURFACE PROCESSING OF SEMICONDUCTOR WORKPIECES

FIELD

The present disclosure relates generally to semiconductor fabrication, and more particularly to surface processing of semiconductor workpieces, such as wide bandgap semiconductor workpieces, such as silicon carbide semiconductor workpieces.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices.

Power semiconductor devices may be packaged into various semiconductor device packages, such as discrete semiconductor device packages and power modules. Power modules may include one or more power devices and other circuit components and can be used, for instance, to dynamically switch large amounts of power through various components, such as motors, inverters, generators, and the like.

Semiconductor devices may be fabricated from wide bandgap semiconductor materials, such as silicon carbide and/or Group III nitride-based semiconductor materials. The fabrication process for power semiconductor devices may require processing of wide bandgap semiconductor wafers, such as silicon carbide semiconductor wafers.

SUMMARY

Aspects and advantages of embodiments of the present disclosure will be set forth in part in the following description, or may be learned from the description, or may be learned through practice of the embodiments.

In an aspect, the present disclosure provides a method. In some implementations, the example method includes obtaining data indicative of a workpiece processing parameter. In some implementations, the example method includes determining a grinding depth for a semiconductor workpiece based at least in part on the data indicative of the workpiece processing parameter. In some implementations, the example method includes performing a grinding operation to remove material from the semiconductor workpiece to reduce a thickness of the semiconductor workpiece by the grinding depth.

In an aspect, the present disclosure provides an example method for grinding semiconductor wafers. In some implementations, the example method includes obtaining an image of a surface of a semiconductor wafer. In some implementations, the example method includes determining a grinding depth for the semiconductor wafer based at least in part on the image. In some implementations, the example method includes performing a grinding operation to remove material from the semiconductor wafer to reduce a thickness of the semiconductor wafer by the grinding depth.

In an aspect, the present disclosure provides an example method for grinding semiconductor workpieces. In some implementations, the example method includes performing a first grinding operation to remove material from a semiconductor workpiece. In some implementations, the example method includes obtaining data indicative of a workpiece processing parameter of the semiconductor workpiece after performing the first grinding operation. In some implementations, the example method includes determining a grinding depth for a semiconductor workpiece based at least in part on the data indicative of the workpiece processing parameter. In some implementations, the example method includes performing a second grinding operation to remove material from the semiconductor workpiece to reduce a thickness of the semiconductor workpiece by the grinding depth.

In an aspect, the present disclosure provides an example method for grinding semiconductor workpieces. In some implementations, the example method includes performing a first grinding operation to remove material from a first semiconductor workpiece. In some implementations, the example method includes obtaining data indicative of a workpiece processing parameter associated with the first semiconductor workpiece. In some implementations, the example method includes determining a grinding depth for a second semiconductor workpiece based at least in part on the data indicative of the workpiece processing parameter. In some implementations, the example method includes performing a second grinding operation to remove material from the semiconductor workpiece to reduce a thickness of the semiconductor workpiece by the grinding depth.

In an aspect, the present disclosure provides an example system for grinding semiconductor workpieces. In some implementations, the example system includes a grinding surface operable to remove semiconductor material from a surface of a semiconductor workpiece. In some implementations, the example system includes a translation stage operable to impart relative motion between the grinding surface and the semiconductor workpiece. In some implementations, the example system includes a sensor operable to obtain data indicative of a workpiece processing parameter. In some implementations, the example system includes control circuitry configured to perform operations. In some implementations of the example system, the operations include determining a grinding depth for a semiconductor workpiece based at least in part on the data indicative of the workpiece processing parameter. In some implementations of the example system, the operations include controlling the grinding surface to remove the semiconductor material from the semiconductor workpiece to reduce a thickness of the semiconductor workpiece by the grinding depth.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which.

DETAILED DESCRIPTION

Figure 1:
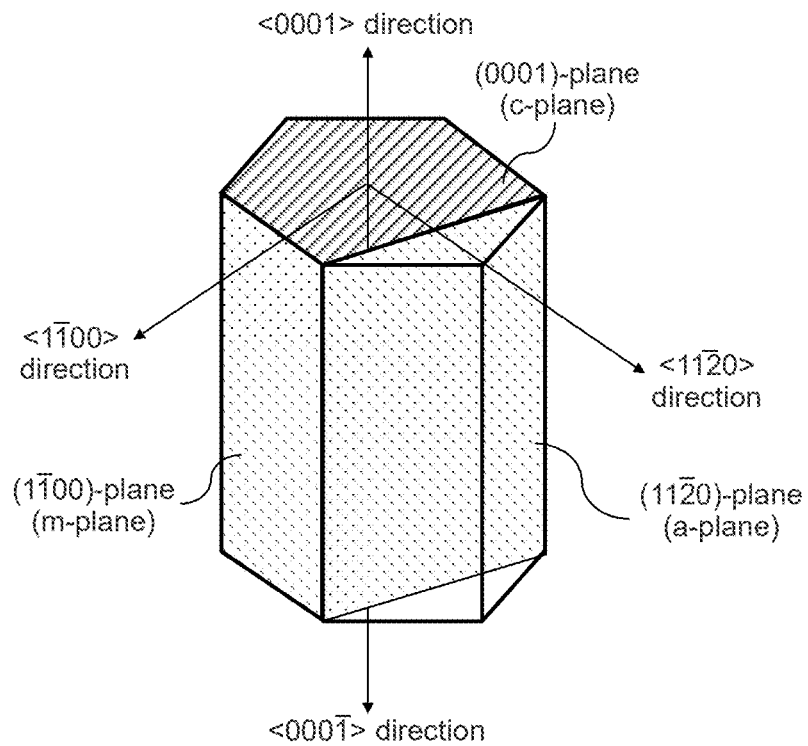
FIG. 1 is a first perspective view crystal plane diagram showing the coordinate system for a hexagonal crystal such as 4H-SiC.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or Group III-nitride-based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the power semiconductor devices according to example embodiments of the present disclosure may be used with any semiconductor material, such as other wide bandgap semiconductor materials and other semiconductor materials (e.g., silicon), without deviating from the scope of the present disclosure. Example wide bandgap semiconductor materials include silicon carbide and the Group III-nitrides.

Power semiconductor devices may be fabricated using epitaxial layers formed on a semiconductor workpiece, such as a silicon carbide semiconductor wafer. Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Other semiconductor workpieces may include carrier substrates, ingots, boules, polycrystalline substrates, monocrystalline substrates, bulk materials having a thickness of greater than 1 mm, such as greater than about 5 mm, such as greater than about 10 millimeters, such as greater than about 20 millimeters, such as greater than about 50 millimeters, such as greater than about 100 millimeters, such as greater than about 200 millimeters, etc.

In some examples, the semiconductor workpiece includes silicon carbide crystalline material. The silicon carbide crystalline material may have a 4H crystal structure, 6H crystal structure, or other crystal structure. The semiconductor workpiece can be an on-axis workpiece (e.g., end face parallel to the (0001) plane) or an off-axis workpiece (e.g., end face non-parallel to the (0001) plane).

Aspects of the present disclosure may make reference to a surface of the semiconductor workpiece. In some examples, the surface of the workpiece may be, for instance, a silicon face of the workpiece. In some examples, the surface of the workpiece may be, for instance, a carbon face of the workpiece.

An ingot or boule refers to a large portion of semiconductor material used in forming semiconductor substrates, commonly semiconductor wafers. A boule may be part of an epitaxially grown crystalline semiconductor material, for example, a wide bandgap semiconductor material. Specifically, in some examples, a boule may include a large portion of epitaxially grown silicon carbide (e.g., 4H silicon carbide) or Group III-nitride. A substrate or semiconductor wafer may be formed from a portion of semiconductor material removed from a boule. The terms "ingot" and "boule" may be used interchangeably in the present disclosure.

In some examples, a semiconductor wafer may be a solid semiconductor workpiece upon which semiconductor device fabrication may be implemented. A semiconductor wafer may be a homogenous material, such as silicon carbide, and may provide mechanical support for the formation and/or carrying of additional semiconductor layers (e.g., epitaxial layers), metallization layers, and other layers to form one or more semiconductor devices. In some examples, a semiconductor wafer may have a thickness in a range of about 0.5 microns to about 1000 microns, or greater.

A semiconductor wafer may be characterized by a plurality of surfaces. For example, a semiconductor wafer may have a "first major surface" and a "second major surface." The first major surface may be generally opposite the second major surface. The first and second major surfaces may be generally parallel to one another. A semiconductor wafer may also have a "side surface" corresponding to a surface extending between the two major surfaces. For example, the side surface may extend between the first major surface and the second major surface.

Power semiconductor device fabrication processes may include surface processing operations that are performed on the silicon carbide semiconductor wafer to prepare one or more surfaces of the silicon carbide semiconductor wafer for later processing steps, such as surface implantation, formation of epitaxial layers, metallization, etc. Example surface processing operations may include grinding operations, lapping operations, and polishing operations. Methods for surface processing of semiconductor wafers in semiconductor manufacturing may include grinding, lapping, and/or polishing the rough surfaces until a sufficient smoothness and/or thickness is achieved.

Grinding is a material removal process that is used to remove material from the semiconductor wafer. Grinding may be used to reduce a thickness of a semiconductor wafer. Grinding typically involves exposing the semiconductor wafer to an abrasive-containing surface, such as grinding teeth on a grind wheel. Grinding may remove material of the semiconductor wafer through engagement with the abrasive surface.

Lapping is a precision finishing process that uses a loose abrasive in slurry form. The slurry typically includes coarser particles (e.g., the largest dimension of the particles being greater than about 100 microns) to remove material from the semiconductor wafer. Lapping typically does not include engaging the semiconductor wafer with an abrasive-containing surface on the lapping tool (e.g., a wheel or disc having an abrasive-containing surface). Instead, the semiconductor wafer typically comes into contact with a lapping plate or a tile usually made of metal. Lapping typically provides better planarization of the semiconductor wafer relative to grinding.

Polishing is a process to remove imperfections and create a very smooth surface with a low surface roughness. Polishing may be performed using a slurry and a polishing pad. The slurry typically includes finer particles relative to lapping, but coarser particles relative to chemical mechanical planarization (CMP). Polishing typically provides better planarization of the semiconductor wafer relative to grinding.

CMP is a type of fine or ultrafine polishing, typically used to produce a smoother surface ready, for instance, for epitaxial growth of layers on the semiconductor wafer. CMP may be performed chemically and/or mechanically to remove imperfections and to create a very smooth and flat surface with low surface roughness. CMP typically involves changing the material of the semiconductor through a chemical process (e.g., oxidation) and removing the new material from the semiconductor wafer through abrasive contact with a slurry and/or other abrasive surface or polishing pad (e.g., oxide removal). In CMP, the abrasive elements in the slurry typically remove the product of the chemical process and do not remove the bulk material of the semiconductor wafer, often leaving very low subsurface damage.

Grinding may include coarse grinding operations and fine grinding operations. Coarse grinding operations may be used to reduce a thickness of a silicon carbide semiconductor wafer by about 20 microns to about 5 millimeters, such as about 20 microns to about 1 millimeter, such as about 20 microns to about 500 microns, such by about 25 microns to about 100 microns, such as by about 25 microns to about 80 microns, such as by about 40 microns to about 60 microns, or the like. Fine grinding operations may be used to reduce a thickness of a silicon carbide semiconductor wafer by about 1 micron to about 20 microns, such as by about 3 microns to about 15 microns, such as by about 5 microns to about 10 microns, or the like. After grinding, the silicon carbide semiconductor wafer may be subject to other surface processing operations, such as lapping operations and/or polishing operations, such as chemical mechanical polishing (CMP) operations.

Current methods for fabricating power semiconductor devices from semiconductor material boules may incur significant material losses and consumable tool losses and costs due to the structural properties of crystalline boules and current methods of separating or fracturing substrates or wafers from a boule. Methods for fabricating power semiconductor devices include forming a crystalline material boule, such as a silicon carbide boule, and separating portions of the boule to form substrates, such as silicon carbide semiconductor wafers. In some instances, boules may be formed to include doped regions with dopants within the crystalline material boule.

Methods for forming semiconductor wafers from boules may include, for instance, cutting thin layers (e.g., wafers) from the boule using wire saws. Another example removal process for forming semiconductor wafers from boules may include a laser-based removal process. Laser-based removal processes may include providing subsurface laser damage patterns to a boule to form weakened areas in the boule. Portions may then be separated from the boule along the weakened areas to produce semiconductor wafers. Separation processes may include, for example, ultrasonic fracturing, mechanical force fracturing, or other fracturing methods. Another example removal process for forming semiconductor wafers from boules may include an implant-based (e.g., hydrogen species implant based) removal processes. Implant-based removal processes may include providing subsurface damage patterns to a boule with implanted species (e.g., hydrogen) to form weakened areas in the boule. Portions may then be separated from the boule along the weakened areas to produce semiconductor wafers. Separation processes may include, for example, ultrasonic fracturing, mechanical force fracturing, or other fracturing methods.

Aspects of the present disclosure are discussed with reference to laser-based, saw-based, and implant-based removal and/or separation for purposes of illustration and discussion. Those of ordinary skill in the art, using the disclosures provided herein, will understand that any separation and/or removal process may be used without deviating from the scope of the present disclosure. For instance, separation of a wafer from a boule can be performed using laser-based removal, sawing and/or other separation layer inducing separation techniques, such as ion implantation, to create separation layer.

The separating (e.g., fracturing) process may produce a rough and uneven surface on both the boule and the crystalline material substrates separated from the boule. For instance, in a laser-based removal process, laser strength, depth, weakened area proximity to other weakened areas, and laser power may contribute to the formation of residual cracks and defects protruding outward from the weakened areas which, in turn, create the rough surface of the boule and the semiconductor wafers removed from the boules.

Semiconductor devices and device manufacturing may require smooth surfaces on a semiconductor workpiece. Accordingly, in some cases, before continuing with further separations of the boule or further manufacturing with the semiconductor workpiece, rough surface(s) may need to be subjected to surface processing operations. For instance, in some examples, the surface of the boule may be smoothed to allow for the formation of subsequent laser damage regions in the boule. Otherwise, a rough surface on the boule may lead to undesirable reflection/refraction of one or more laser(s) used during the formation of the subsurface laser damage regions or implant damage regions for removal of subsequent semiconductor wafers. Methods for surface processing of boules and substates (e.g., semiconductor wafers) in semiconductor manufacturing may include grinding, lapping, and/or polishing the rough surfaces until sufficient smoothness is achieved.

In some instances, several grinding processes and/or other surface processing operations are performed to achieve sufficient smoothness. For instance, a coarse grinding process may reduce substantial irregularities or impurities and reduce wafer thickness, and a fine grinding process may finalize the surface and achieve sufficient smoothness for further fabrication processes (e.g., lapping and/or polishing).

Grinding methods may incur substantial time, material, and consumable tool loss and cost due to the structural properties of the crystalline materials used in semiconductor devices and the smoothness requirements of semiconductor devices. Materials used in wide bandgap semiconductor devices, such as, for example, silicon carbide, have extreme rigidity and strength requiring expensive tools (e.g., with diamond abrasive elements) that are rapidly consumed. The grinding process also results in material losses from grinding away potentially usable material to provide a sufficiently smooth surface for semiconductor device manufacturing.

Aspects of the present disclosure are directed to using one or more surface processing operations for processing semiconductor workpieces such as boules, semiconductor wafers, or any semiconductor workpieces. For instance, aspects of the present disclosure are directed to a method for grinding semiconductor workpieces (e.g., wide bandgap semiconductor workpieces) including obtaining data indicative of a workpiece processing parameter and determining a grinding depth for a semiconductor workpiece based at least in part on the data indicative of the workpiece processing parameter. Thereafter, the method includes performing a grinding operation to remove material from the semiconductor workpiece to reduce a thickness of the semiconductor workpiece by the grinding depth.

In some examples, the semiconductor workpiece being processed can be a semiconductor wafer or a semiconductor boule. In such examples, the workpiece processing parameter can be a wafer removal parameter. The wafer removal parameter may be indicative of processing information used to separate semiconductor wafers from, for instance, a boule. For instance, the wafer removal parameter can be at least one of a wafer separation type, a laser power, a position of the semiconductor wafer within a semiconductor boule, or a material type of the semiconductor wafer.

In further examples, the workpiece processing parameter can be a grinding parameter. The grinding parameter can provide information indicative of a grinding process or grinding system used to grind the semiconductor workpiece. For instance, the grinding parameter can be at least one of a grinding surface wear (e.g., the amount wear incurring by the grind surface), a grinding surface medium (e.g., the medium from which the grind surface is formed), or a grinding surface speed (e.g., the speed at which the grinding surface is moved relative to the surface being ground).

In some examples, the data indicative of the workpiece processing parameter can be an image, such as an image of the surface of the semiconductor workpiece to be processed via the grinding operation. In such examples, determining the grinding depth can include inputting the image into a model (e.g., a machine learned model) and obtaining an output of the model that is indicative of an additional grind depth. Thereafter, the additional grind depth may be determined based at least in part on the output of the model. In some implementations, the model can be a machine-learned model, such as a neural network. For example, the machine-learned model is trained to provide the output (e.g., grind depth) based at least in part on the image that is input into the model. In some implementations, the machine-learned model can be a neural network, such as a convolutional neural network.

As used herein, an image is any two-dimensional representation of data associated with positional coordinates of a semiconductor workpiece. Data (nondestructive and destructive) that is spatially coordinated (e.g., to an x and y position of a workpiece) may be referred to as an image. In some examples, the images may be, for instance, optical surface microscopy images, photoluminescence (PL) microscopy images, cross-polarized light imaging images, and x-ray topography images, scanning electron microscopy images, or other images.

The images may be, for instance, nondestructive and/or destructive images of the workpiece. As used herein, the terms "nondestructive data" and "nondestructive image" of a workpiece respectively refer to data and an image that have been obtained without destroying, consuming, or otherwise damaging the workpiece. In this regard, nondestructive data and nondestructive images may be obtained for a workpiece on which one or more devices may subsequently be formed. For example, a spatially coordinated PL image of an unetched silicon carbide workpiece may be referred to as a nondestructive image. In contrast, the terms "destructive data" and "destructive image" refer to data or an image of a workpiece that has been destroyed, consumed, or otherwise damaged to the point that subsequent devices may not be formed thereon. For example, any spatially coordinated image of a semiconductor workpiece that has been etched with KOH/EOH or the like to delineate etch pits may be referred to as a destructive image. Additionally, nondestructive and destructive data and corresponding images may include one or more data signals or data channels. For example, a data signal may comprise a light emission characteristic from a crystalline feature analyzed through a light filter. Data signals may correspond to absorption signals and/or emission signals.

The image can be captured by a suitable imaging device, such as PL microscope, x-ray topographic imaging source, cross-polarized light imaging source, camera, scanning electron microscope, etc. In some examples, the image may be a composite image of the semiconductor workpiece that has been stitched or aggregated together from multiple images (e.g., multiple different types of images).

The image can span an entire surface of the semiconductor workpiece. In some examples, the image can span a portion of the semiconductor workpiece. In some examples, multiple smaller images depicting portions of the semiconductor workpiece can be stitched or joined together to form the image.

In further examples, other data and/or workpiece processing parameters can be used to determine the grinding depth. For example, in some examples, the data indicative of the workpiece processing parameter further can be one or more predetermined value(s). The predetermined value can, in turn, be a parameter value that is preset or otherwise predetermined, e.g., by the operator. For example, the operator can input or otherwise provide (e.g., via a suitable user interface) one or more workpiece processing parameters, such as one or more wafer removal parameters and/or one or more grinding parameters. In other examples, the data indicative of the workpiece processing parameter can be a surface topological mapping of the surface of the semiconductor workpiece to be processed via the grinding operation. In other examples, the data indicative of the workpiece processing parameter can be obtained from an optical sensor and/or one or more surface measurement lasers.

In some examples, the grinding depth can be determined based at least in part on a plurality of types of data indicative of a workpiece processing parameter. More specifically, in some examples, determining the grinding depth for the semiconductor workpiece can include determining a first adjustment to the grinding depth based at least in part on the predetermined value. Such predetermined parameter value(s) can then be used to determine the grinding depth. Thereafter, determining the grinding depth for the semiconductor workpiece can include determining a second adjustment to the grinding depth based at least in part on an image of the surface of the semiconductor workpiece that is obtained. In some examples, the first adjustment is greater than the second adjustment. Thus, in such examples, the first adjustment may be similar to a "coarse" adjustment based at least in part on preset process or system parameters and the second adjustment may be similar to a "fine" adjustment based at least in part on the actual output of the process/system.

In some examples, the method includes performing a first grinding operation to remove material from the semiconductor workpiece before obtaining the data indicative of the workpiece processing parameter for the semiconductor workpiece. As such, the first grinding operation removes the semiconductor material from the semiconductor workpiece to reduce the thickness of the semiconductor workpiece by a first depth. Then, the data indicative of the workpiece processing parameter for the semiconductor workpiece is obtained and the grinding depth is determined for the semiconductor workpiece based at least in part on the obtained data. Thereafter, the method includes performing a second grinding operation to remove the semiconductor material from the semiconductor workpiece to reduce the thickness of the semiconductor workpiece by the grinding depth. In some examples, the first depth is less than the grinding depth. That is, in such examples, the grinding depth is determined based at least in part on data indicative of the workpiece processing parameter after an initial grinding operation is performed.

In some examples, the method includes performing a grinding operation to remove material from a first semiconductor workpiece. Then, the method includes obtaining data indicative of the workpiece processing parameter associated with the first semiconductor workpiece. Next, the grinding depth is determined for a second semiconductor workpiece (e.g., a future to be processed semiconductor workpiece) based at least in part on the obtained data. Thereafter, the method includes performing a second grinding operation that removes the semiconductor material from the second semiconductor workpiece to reduce the thickness of the semiconductor workpiece by the grinding depth. That is, in such examples, data indicative of the workpiece processing parameter associated with a first semiconductor workpiece is used to determine the grinding depth for a different, second semiconductor workpiece.

In some examples, as mentioned above, the semiconductor workpiece may be a semiconductor wafer removed from a semiconductor boule. In such examples, the semiconductor wafer is removed from a portion of the boule using a removal process before the grinding operation is performed on the semiconductor wafer. For example, in some implementations, a laser-based removal process is used. Specifically, the laser-based removal process includes inducing a subsurface laser damage region in the semiconductor boule and separating the semiconductor wafer from the boule along the subsurface laser damage region. In other examples, the wide bandgap semiconductor workpiece may be the boule from which the semiconductor wafer has been removed. In other implementations, a wire saw may be used to remove the semiconductor wafer from the boule. In further implementations, an implant-based (e.g., hydrogen species implant based) removal process may be used.

When performing the grinding operation on semiconductor workpiece, relative motion may be imparted between the semiconductor workpiece and a grinding surface of the grinding system. It should be appreciated that both moving the grinding surface relative to the semiconductor workpiece and moving the semiconductor workpiece relative to the grinding surface may fall within the scope of the present disclosure.

In addition, the grinding depth determined for the semiconductor workpiece can be at least about 25 microns or greater. For example, the grinding depth may be about 40 microns to about 100 microns, such as by about 50 microns to about 80 microns, such as by about 40 microns to about 70 microns, or the like.

During the grinding operation according to examples of the present disclosure, the grinding surface may, for example, be moved across at least 85% of a surface of the semiconductor workpiece through relative motion between the grinding surface and the semiconductor workpiece, such as at least 95% of the surface of the semiconductor workpiece, such as at least 99% of the surface of the semiconductor workpiece. The surface of the semiconductor workpiece may be ground by the grinding surface in one or more passes.

Aspects of the present disclosure are additionally directed to systems for implementing the methods discussed herein. For instance, aspects of the present disclosure relate to a system for grinding semiconductor workpieces. The grinding system, in turn, includes a grinding surface operable to remove semiconductor material from a surface of a semiconductor workpiece (e.g., boule, substrate, wafer, etc.). Furthermore, the grinding system includes a workpiece support on which the semiconductor workpiece is mounted. Thus, by moving the grinding surface relative to the workpiece support, relative motion between the grinding surface and the semiconductor workpiece can be imparted. For example, in some implementations, the grinding system may be a Blanchard grinder. In such implementations, the grinding system may include a rotary table and a vertical spindle that holds a grind wheel with a plurality of abrasive grinding teeth. The grinding teeth may include an abrasive containing material having abrasive elements. In some embodiments, the abrasive elements may include one or more of: (i) diamond; (ii) ceramic; (iii) metal nitride; (iv) metal oxide; (v) metal carbide; (vi) metalloid nitride; (vii) metalloid oxide; (viii) metalloid carbide; (ix) carbon group nitride; (x) carbon group oxide; or (xi) carbon group carbide. The semiconductor workpiece may be mounted on a workpiece support, such as the rotary table, for instance, using a chuck (e.g., vacuum chuck). In some examples, the axis of rotation of the semiconductor wafer is not aligned with the axis of rotation of the grind wheel. During the grinding process, the grinding teeth on the grind wheel traverse across a portion of the surface of the workpiece, removing material from the semiconductor wafer. Additionally, the grinding system includes a translation stage operable to impart relative motion between the grinding surface and the semiconductor workpiece.

Additionally, in some examples, the system may include at least one sensor and control circuitry (e.g., one or more controllers or computing devices). The sensor(s) may be operable to obtain data indicative of a workpiece processing parameter. For instance, the sensor may be an optical sensor, image capture device, or one or more surface measurement lasers. The control circuitry may receive data from the at least one sensor and determine a grinding depth for a semiconductor workpiece based at least in part on the workpiece processing parameter. The control circuitry may control the grinding surface of the grinding system to remove the material from the surface of the semiconductor workpiece based, at least in part, on the grinding depth.

Aspects of the present disclosure are discussed with reference to a surface processing operation that includes a grinding operation that includes a grind wheel with an abrasive surface (e.g., abrasive teeth) for purposes of illustration and discussion. Those of ordinary skill in the art, using the disclosures provided herein, will understand that aspects of the present disclosure are depicted to any grinding method for grinding semiconductor workpieces (e.g., grind disk, laser-based grinding, Electrical discharge machining (EDM) based grinding), or other surface processing operations (e.g., lapping, polishing, chemical mechanical polishing, electrochemical mechanical polishing) etc. without deviating from the scope of the present disclosure.

Aspects of the present disclosure provide a number of technical effects and benefits. For instance, aspects of the present disclosure allow for surface processing of semiconductor material surfaces using a grinding system in a manner that reduces the consumption of the consumable abrasive tools and materials. More specifically, aspects of the present disclosure allow for the amount of semiconductor material being removed from the surface of the semiconductor workpiece using the grinding system to be determined based at least in part on the characteristics of (e.g., the damage present on) the semiconductor workpiece or other similarly situated semiconductor workpieces. By determining grinding depth through the use of the workpiece processing parameter(s), only the material necessary to eliminate the damage on the surface of the workpiece is removed. This, in turn, results in a slower rate of consumption of abrasive materials and therefore considerably reduces the manufacturing cost and time of semiconductor devices with high material strength and rigidity, such as silicon carbide. Additionally, by not removing unnecessary material from the semiconductor workpiece, the cycle time for processing such workpieces is reduced and the yield of such processing is increased.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based at least in part on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

FIG. 1 is a first perspective view crystal plane diagram showing the coordinate system for a hexagonal crystal such as 4H-silicon carbide ("SiC"), in which the c-plane (0001) is perpendicular to both the m-plane (1100) and the a-plane (1120). The c-plane is perpendicular to the <0001> direction. The m-plane (1100) is perpendicular to the <1100> direction. The a-plane (1120) is perpendicular to the <1120> direction. The <0001> direction is opposite the <0001>direction.

Figure 2:
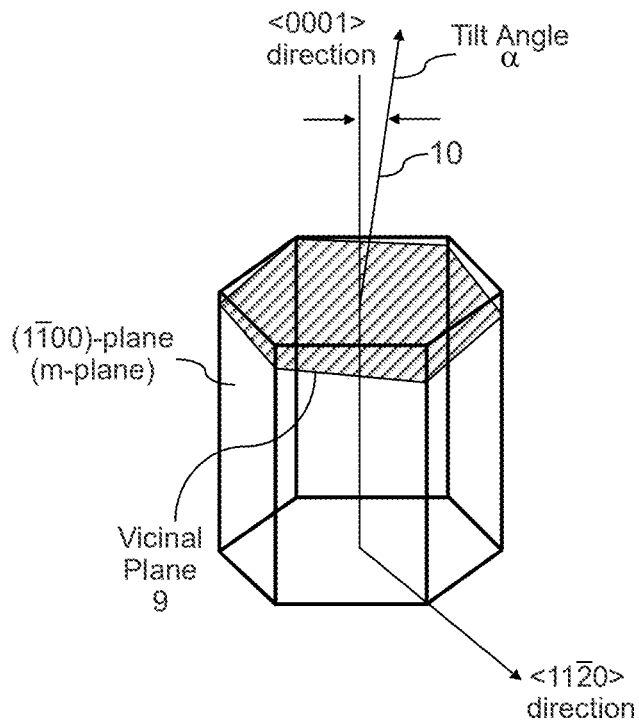
FIG. 2 is a second perspective view crystal plane diagram for a hexagonal crystal, illustrating a vicinal plane that is non-parallel to the c-plane.

FIG. 2 is a second perspective view crystal plane diagram for a hexagonal crystal, illustrating a vicinal plane 9 that is non-parallel to the c-plane, wherein a vector 10 (which is normal to the vicinal plane 9) is tilted away from the <0001> direction by a tilt angle α, with the tilt angle α being inclined (slightly) toward the <1120> direction.

Figure 3A:
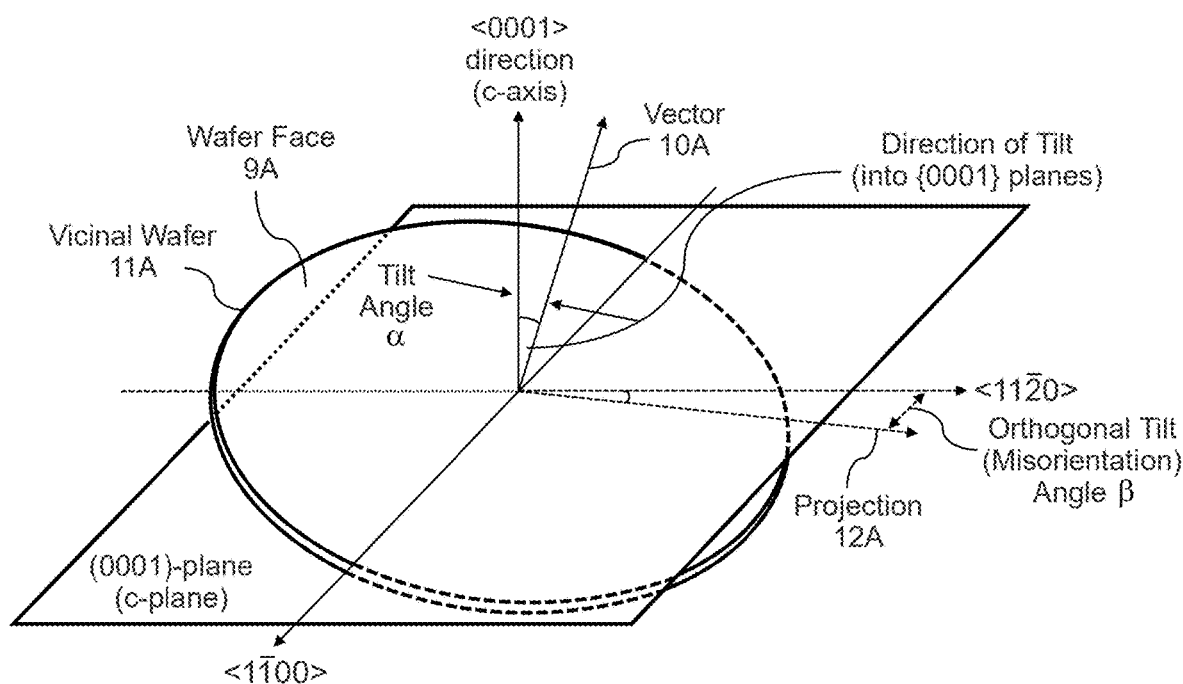
FIG. 3A is a perspective view wafer orientation diagram showing the orientation of a vicinal wafer relative to the c-plane.

FIG. 3A is a perspective view of a wafer orientation diagram showing the orientation of a vicinal wafer 11A relative to the c-plane (0001), in which a vector 10A (which is normal to the wafer face 9A) is tilted away from the <0001> direction by a tilt angle α. An orthogonal tilt (or misorientation angle) β may span between the <1120> direction and the projection of vector 10A onto the c-plane.

Figure 3B:
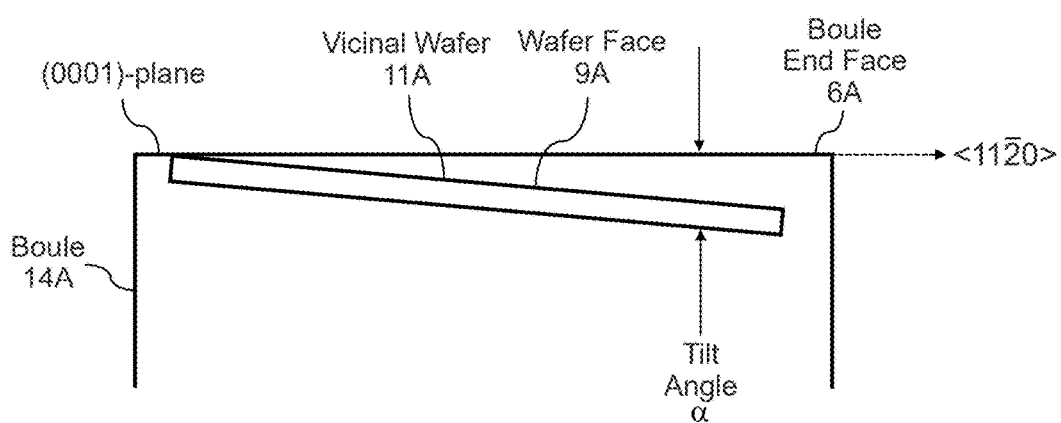
FIG. 3B is a simplified cross-sectional view of the vicinal wafer of FIG. 3A superimposed over a portion of a boule.

FIG. 3B is a simplified cross-sectional view of the vicinal wafer 11A superimposed over a portion of a boule 14A (e.g., an on-axis boule having an end face 6A parallel to the (0001) plane) from which the vicinal wafer 11A was defined. FIG. 3B shows that the wafer face 9A of the vicinal wafer 11A is misaligned relative to the (0001) plane by a tilt angle α.

Figure 3C:
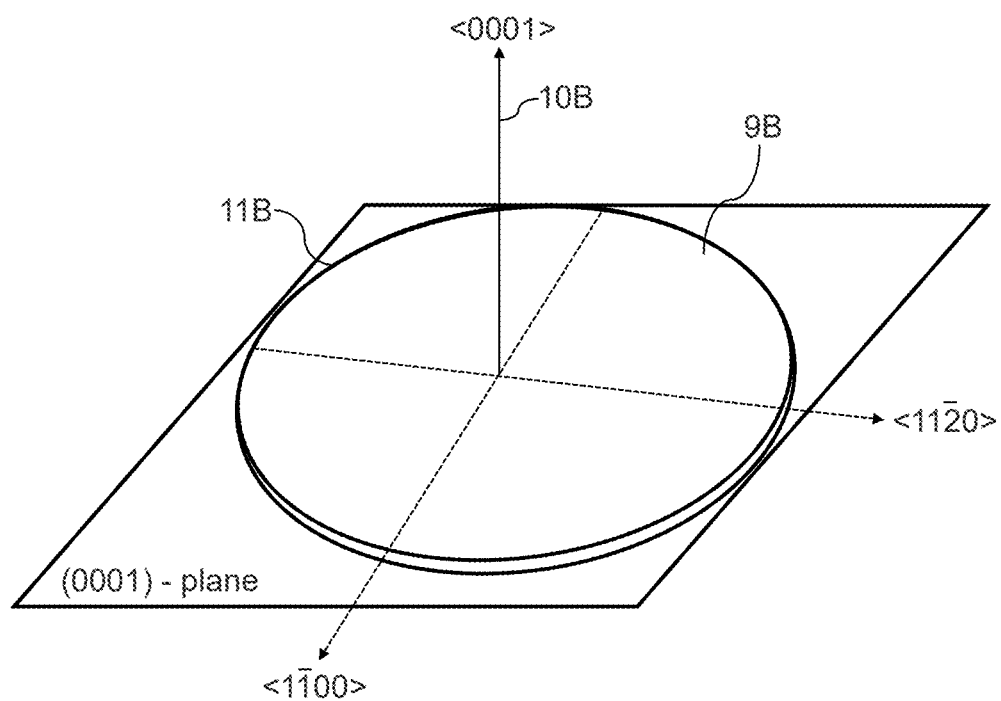
FIG. 3C is a perspective view of a wafer orientation diagram showing the orientation of an on-axis wafer relative to the c-plane.
Figure 3D:
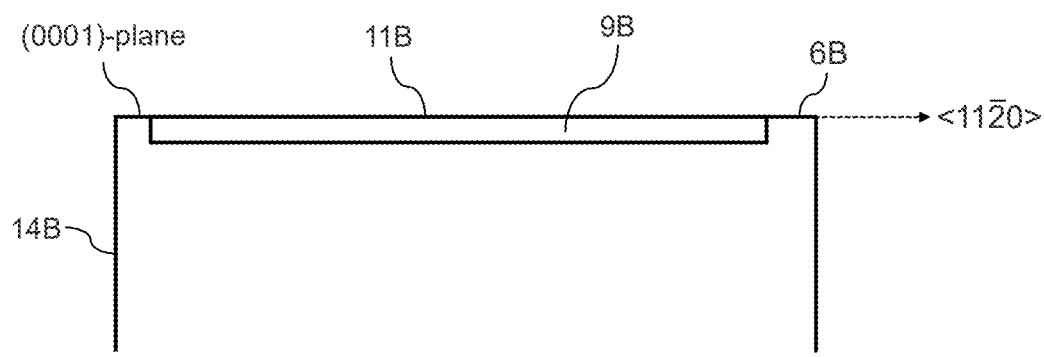
FIG. 3D is a simplified cross-sectional view of the wafer of FIG. 3C superimposed over a portion of a boule.

FIG. 3C is a perspective view of a wafer orientation diagram showing the orientation of an on-axis wafer 11B relative to the c-plane (0001), in which a vector 10B (which is normal to the wafer face 9B) is parallel to the <0001> direction. FIG. 3D is a simplified cross-sectional view of the wafer 11B superimposed over a portion of a boule 14B (e.g., an on-axis boule having an end face 6B parallel to the (0001) plane). FIG. 3D shows that the wafer face 9B of the on-axis-wafer 11B is aligned with the (0001) plane.

Figure 4:
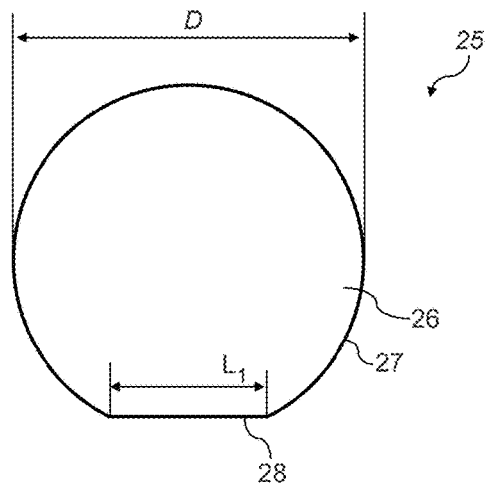
FIG. 4 is a top plan view of an exemplary SiC wafer, with superimposed arrows showing crystallographic orientation directions.

FIG. 4 is a top plan view of an example silicon carbide semiconductor wafer 25 including an upper face 26. The silicon carbide semiconductor wafer 25 may include a surface that is misaligned with (e.g., off-axis at an oblique angle relative to) the c-plane. The silicon carbide semiconductor wafer 25 may be laterally bounded by a generally round edge 27 (having a diameter D) including a primary flat 28 (having a length $L_1$) that is perpendicular, for instance, to the (1120) plane. In some instances, the wafer 25 may include a notch instead of a primary flat.

Methods disclosed herein may be applied to substrates of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Example materials include, but are not limited to, silicon, gallium arsenide, and diamond.

In certain embodiments, such methods may utilize single crystal semiconductor materials having a hexagonal crystal structure, such as 4H-SiC, 6H-SiC, or Group III-nitride materials (e.g., GaN, AlN, InN, InGaN, AlGaN, or AlInGaN). Various illustrative embodiments described hereinafter mention SiC generally or 4H-SiC specifically, but it is to be appreciated that any suitable crystalline material may be used. Among the various SiC polytypes, the 4H-SiC polytype is particularly attractive for power electronic devices due to its high thermal conductivity, wide bandgap, and isotropic electron mobility. Bulk silicon carbide may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming n-doped or highly conductive material).

Certain embodiments herein may use substrates of doped or undoped silicon carbide, such as silicon carbide boules, which may be grown by physical vapor transport (PVT) or other conventional boule fabrication methods. If doped SiC is used, such doping may render the SiC n-type or semi-insulating in character. In certain embodiments, an n-type silicon carbide boule is intentionally doped with nitrogen. In certain embodiments, an n-type silicon carbide boule includes resistivity values within a range of 0.015 to 0.028 Ohm-centimeters. In certain embodiments, a silicon carbide boule may have resistivity values that vary with vertical position, such that different substrate portions (e.g., wafers) have different resistivity values, which may be due to variation in bulk doping levels during boule growth. In certain embodiments, a silicon carbide boule may have doping levels that vary horizontally, from a higher doping region proximate to a center of the boule to a lower doping level proximate to a lateral edge thereof.

Figure 5A:
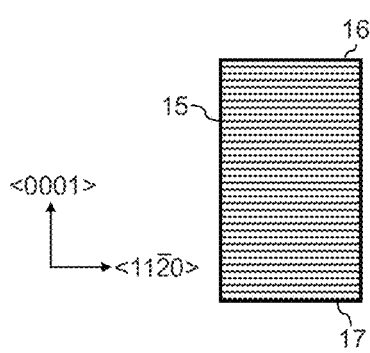
FIG. 5A is a side elevation schematic view of an on-axis boule of crystalline material.
Figure 5B:
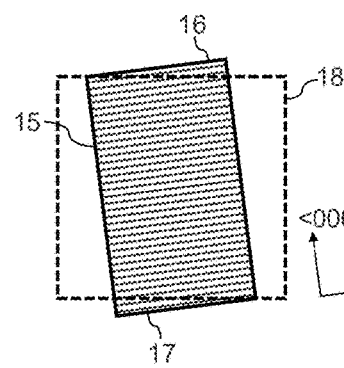
FIG. 5B is a side elevation schematic view of the boule of FIG. 5A being rotated by 4 degrees, with a superimposed pattern for cutting end portions of the boule.
Figure 5C:
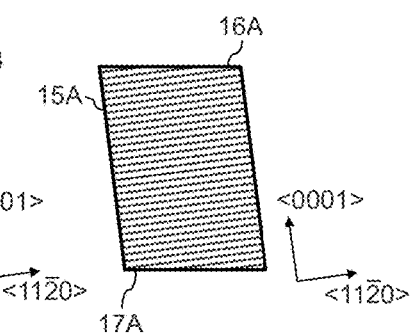
FIG. 5C is a side elevation schematic view of a boule following removal of end portions to provide end faces that are non-perpendicular to the c-direction.

FIGS. 5A and 5C schematically illustrate on-axis and off-axis crystalline substrates in the form of boules that may be utilized with methods disclosed herein. FIG. 5A is a side elevation schematic view of an on-axis boule 15 of crystalline material having first and second end faces 16, 17 that are perpendicular to the c-direction (i.e., <0001> direction for a hexagonal crystal structure material such as 4H-SiC). FIG. 5B is a side elevation schematic view of the boule 15 of FIG. 5A being rotated by four degrees, with a superimposed pattern 18 (shown in dashed lines) for cutting and removing end portions of the boule 15 proximate to the end faces 16, 17. FIG. 5C is a side elevation schematic view of an off-axis boule 15A formed from the boule 15 of FIG. 5B, following the removal of end portions to provide new end faces 16A, 17A that are non-perpendicular to the c-direction. Aspects of the present disclosure are applicable to both on-axis boules 15 and/or off-axis boules 15A or other on-axis crystalline materials and/or off-axis crystalline materials.

Figure 5D:
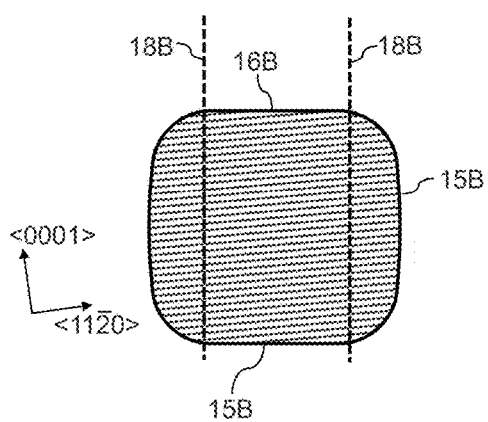
FIG. 5D is a side elevation schematic view of an off-axis grown boule of crystalline material.
Figure 5E:
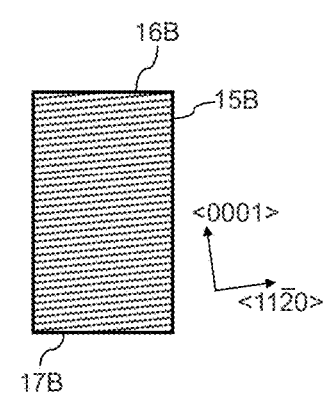
FIG. 5E is a side elevation schematic view of an off-axis grown boule having end faces that are non-perpendicular to the c-direction.

FIGS. 5D and 5E schematically illustrate off-axis grown boules that may be utilized with methods disclosed herein. FIG. 5D is a side elevation schematic view of an off-axis grown boule 15B of crystalline material (e.g., grown from an off-axis seed material) having first and second end faces 16B and 17B that are non-perpendicular to the c-direction (e.g., <0001>direction for a hexagonal crystal structure material such as 4H-SiC). Portions of the boule 15B may be cut along the superimposed pattern 18B (shown in dashed lines) to provide the off-axis boule 15B shown in FIG. 5E. Off-axis semiconductor wafers may be provided from the off-axis boule 15E by cutting or otherwise removing the wafers from the boule 15B in a manner parallel to the faces 16B, 17B.

Aspects of the present disclosure are directed to providing semiconductor wafers from any suitable boule, such as an on-axis boule, an off-axis boule, an on-axis grown boule, and off-axis grown boule, a boule grown along other directions or axes (e.g., a-axis, c-axis) or other suitable boule.

Figure 6:
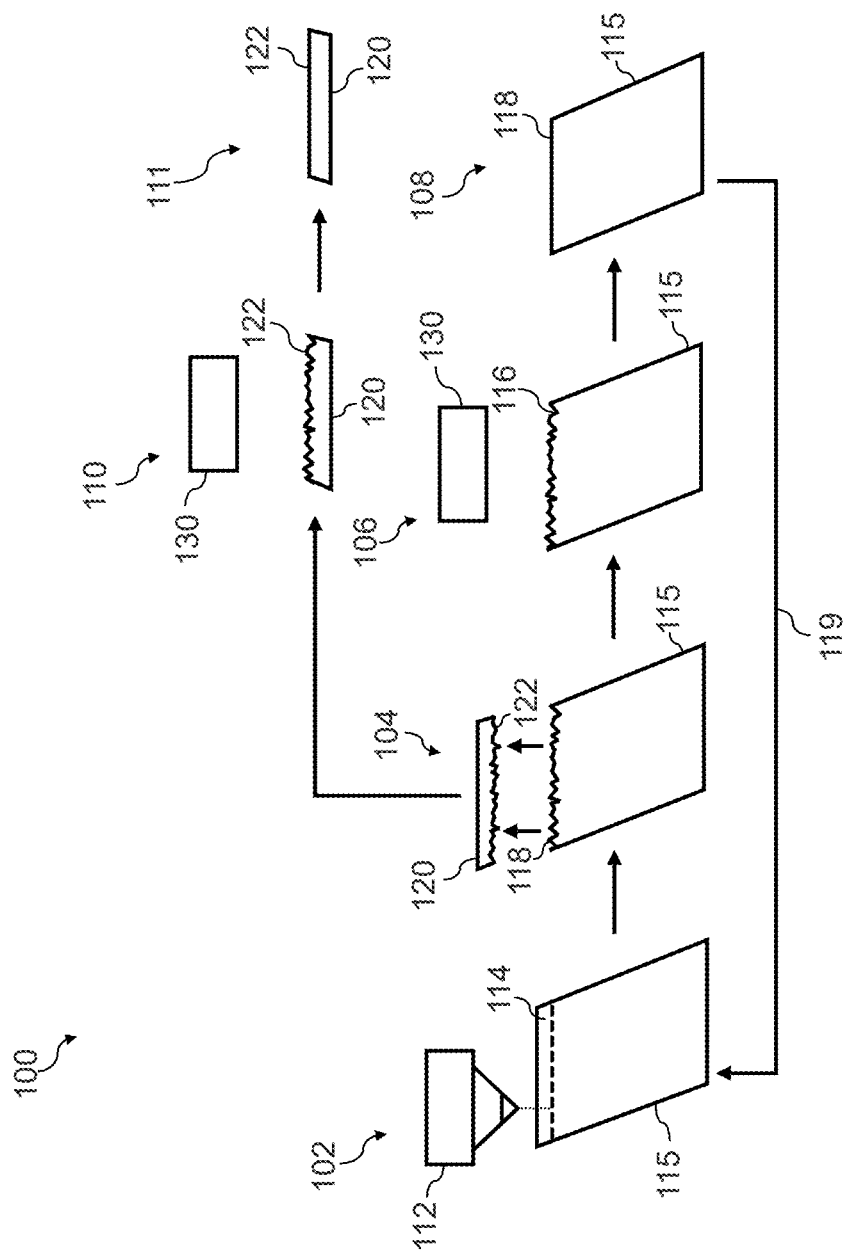
FIG. 6 depicts an overview of an example method according to examples of the present disclosure.

FIG. 6 depicts an overview of an example method 100 according to example embodiments of the present disclosure. FIG. 6 is intended to represent structures for identification and description and is not intended to represent the structures to physical scale. The method 100 depicts operations in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 102, the method 100 may include performing a removal process on a boule 115 (e.g., a laser-based removal process, a wire saw-based removal process, an implant-based removal processes, etc.). For instance, one or more laser source(s) 112 may be operated according to one or more laser parameters to induce a subsurface laser damage region 114 in the boule 115. The boule 115 may be similar to the boule 15 or the off-axis boule 15A of FIGS. 5A and 5C respectively.

Referring to FIG. 6 at 104, the method 100 may include separating a semiconductor wafer 120 from the boule 115 along the subsurface laser damage region 114. Removing the wafer 120 from the boule 115 may be performed through a variety of methods. For instance, a mechanical fracturing process, ultrasonic fracturing process, or other fracturing process may be used to fracture and separate the semiconductor wafer 120 from the boule 115. FIG. 6 illustrates a laser-based removal process for purposes of illustration and discussion. Those of ordinary skill in the art, using the disclosures provided herein, will understand that other separation and/or removal processes may be used without deviating from the scope of the present disclosure, such as saw-based removal processes and/or implanted-species based removal processes.

In some instances, separating the wafer 120 from the boule 115 may leave rough exposed surfaces on both the semiconductor wafer 120 and the boule 115. For instance, the semiconductor wafer 120 may have a surface 122 with high surface roughness, such as a surface roughness greater than about 65 microns. Similarly, the boule 115 may have a surface 118 with high surface roughness, such as a surface roughness greater than about 65 microns.

Certain example aspects of the present disclosure are directed to using grinding-based surface processing operations to remove material from the semiconductor workpieces to a grinding depth to provide smoother surfaces suitable for later fabrication operations. As an example, as shown at 106, the method may include grinding the surface 118 of the boule 115 using a grinding system 130 to remove material from the surface 118. Such grinding may result in a smoother surface 118 of the boule 115 as shown at 108.

By processing the surface 118 of the boule 115 with the grinding system 130 as shown at 106, the boule 115 may be suitable to be reused for subsequent removal processes as indicated by arrow 119 (e.g., subsequent laser-based removal processes). More particularly, the surface 118 of the boule 115 may be smoothed to allow for the formation of subsequent laser damage regions 114 in the boule 115. Otherwise, a rough surface on the boule 115 may lead to undesirable reflection/refraction of one or more laser(s) used during the formation of the subsurface laser damage regions for removal of subsequent semiconductor wafers. In some examples, additional surface processing operations may occur on the boule 115 before subsequent removal processes (e.g., polishing, lapping, etc.).

As another example, as shown at 110, the method may include grinding the surface 122 of the semiconductor wafer 120 using the grinding system 130 to remove material from the surface 122. Such grinding may result in a smoother surface 122 of the semiconductor wafer 120 as shown at 111. Accordingly, the semiconductor wafer 120 may be suitable for subsequent semiconductor device fabrication operations.

Aspects of the present disclosure are discussed with reference to a laser-based removal process for separating the semiconductor wafer from the boule for purposes of illustration and discussion. Those of ordinary skill in the art, using the disclosures provided herein, will understand that aspects of the present disclosure are depicted to any removal process for separating the semiconductor wafer from the boule (e.g., a wire saw-based removal, an implant-based removal processes, etc.) without deviating from the scope of the present disclosure.

Figure 7:
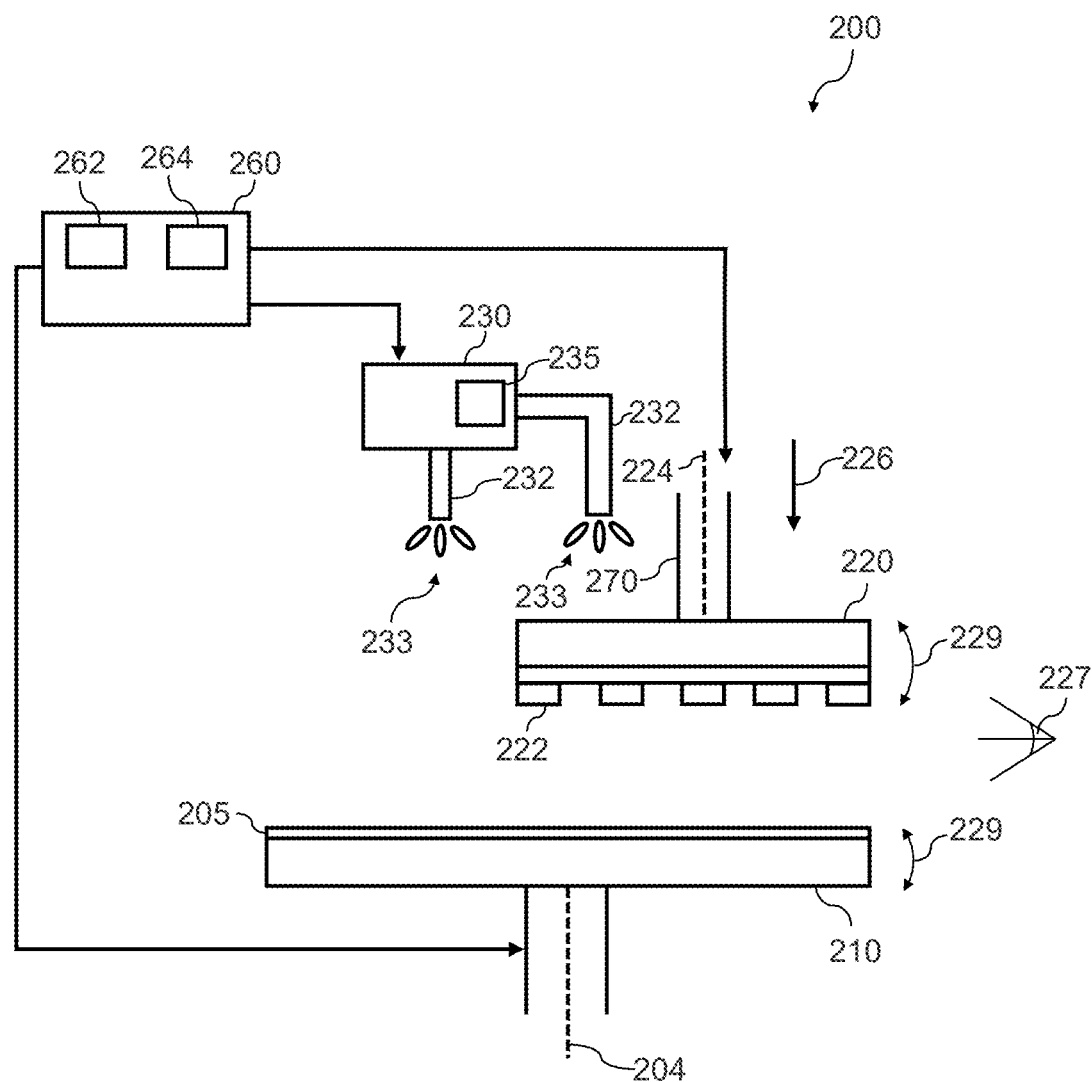
FIG. 7 depicts an example grinding system according to examples of the present disclosure.

FIG. 7 depicts an example grinding system 200 for grinding a semiconductor workpiece according to example embodiments of the present disclosure. In some examples, the grinding system 200 includes a workpiece support 210, a grinding surface 220 (e.g., a grind wheel), a delivery system 230 (e.g., coolant delivery system), and control circuitry 260. In some examples, the control circuitry 260 may include one or more controllers or computing devices that, in turn, include one or more processors 262 and one or more memory devices 264. The one or more memory devices 264 may store computer-readable instructions that when executed by the one or more processors 262 cause the one or more processors 262 to perform one or more control functions, such as any of the functions described herein. Additionally, in some examples, the grinding system 200 may include a translation stage 270 that may be configured to move the grind surface 220 relative to the workpiece support 210. Further, the grinding system 200 may, in some instances, be a Blanchard grinding system.

More specifically, the grinding system 200 includes the workpiece support 210. The workpiece support 210 may be operable to support or carry the semiconductor workpiece 205. The workpiece support 210 may include a chuck operable to hold the semiconductor workpiece 205. The chuck may be a vacuum chuck, electrostatic chuck, or other suitable support operable to hold the semiconductor workpiece 205 in place during a grinding operation. The workpiece support 210 may be operable to rotate about an axis 204. The workpiece support 210 may be operable to rotate about the axis 204 in either a clockwise or counterclockwise direction. In some examples, the workpiece support 210 may rotate, for instance, at a rotational speed in a range of about 40 rpm to about 10000 rpm, such as about 40 rpm to about 7500 rpm, such as about 40 rpm to about 2000 rpm, such as about 40 rpm to about 1000 rpm, such as about 40 rpm to about 500 rpm, such as about 40 rpm to about 120 rpm.

The grinding system 200 includes the grind surface 220, such as a grind wheel. The grind surface 220 includes a plurality of grinding teeth 222 arranged in an annular configuration about the grind surface 220 to form a grinding ring. A grinding ring is any annular or partially annular structure of grinding teeth or other abrasive-containing surface on a grind wheel. A grinding ring may have any suitable shape and does not necessarily have to be circular in shape. The grinding teeth 222 provide an abrasive surface for the grind surface 220. One or more of the grinding teeth 222 may include an abrasive containing material. The abrasive containing material of the grinding teeth 222 may be sufficient to perform a grinding operation on a semiconductor workpiece, such as a wide bandgap semiconductor (e.g., silicon carbide). In some examples, each of the plurality of grinding teeth 222 have an abrasive containing material. In some examples, only a subset of the plurality of grinding teeth 222 have an abrasive containing material. For instance, as one example, every other grind tooth in the plurality of grinding teeth 222 may have an abrasive containing material. The other grinding teeth in the plurality of grinding teeth may not include an abrasive containing material.

The abrasive containing material may include a plurality of abrasive elements (e.g., abrasive particles) in a host material or matrix. In some examples, the host material may include one or more of vitreous material, metal, resin, and/or other sintered material and/or organic material. The vitreous material may be a glass matrix material to hold the abrasive elements inside a matrix. Metals and/or organic materials may be used as a host matrix or as part of a host matrix for the abrasive elements. The abrasive elements in some embodiments, may be diamond (e.g., diamond abrasive particles) or a diamond coated material. In some embodiments, the abrasive elements may be, for instance, a ceramic material (e.g., ceramic abrasive particles). The ceramic material may be, for instance, boron carbide ($B_4C$) and cubic boron nitride (BN). In some examples, the abrasive elements may include one or more metal oxides (sintered and/or unsintered). In some embodiments, the abrasive elements may include silica, ceria, zirconia, alumina, silicon carbide, metal nitrides, and/or other carbides. In some examples, the abrasive elements of the grinding teeth 222 may have a hardness in a range of about 7 Mohs to about 10 Mohs, such as about 10 Mohs.

The grinding surface 220 may be configured to remove material from a surface of the semiconductor workpiece 205 to a grinding depth. In some examples, the grinding depth may be about 40 microns to about 100 microns, such as by about 50 microns to about 80 microns, such as by about 40 microns to about 70 microns, or the like.

Figure 8:
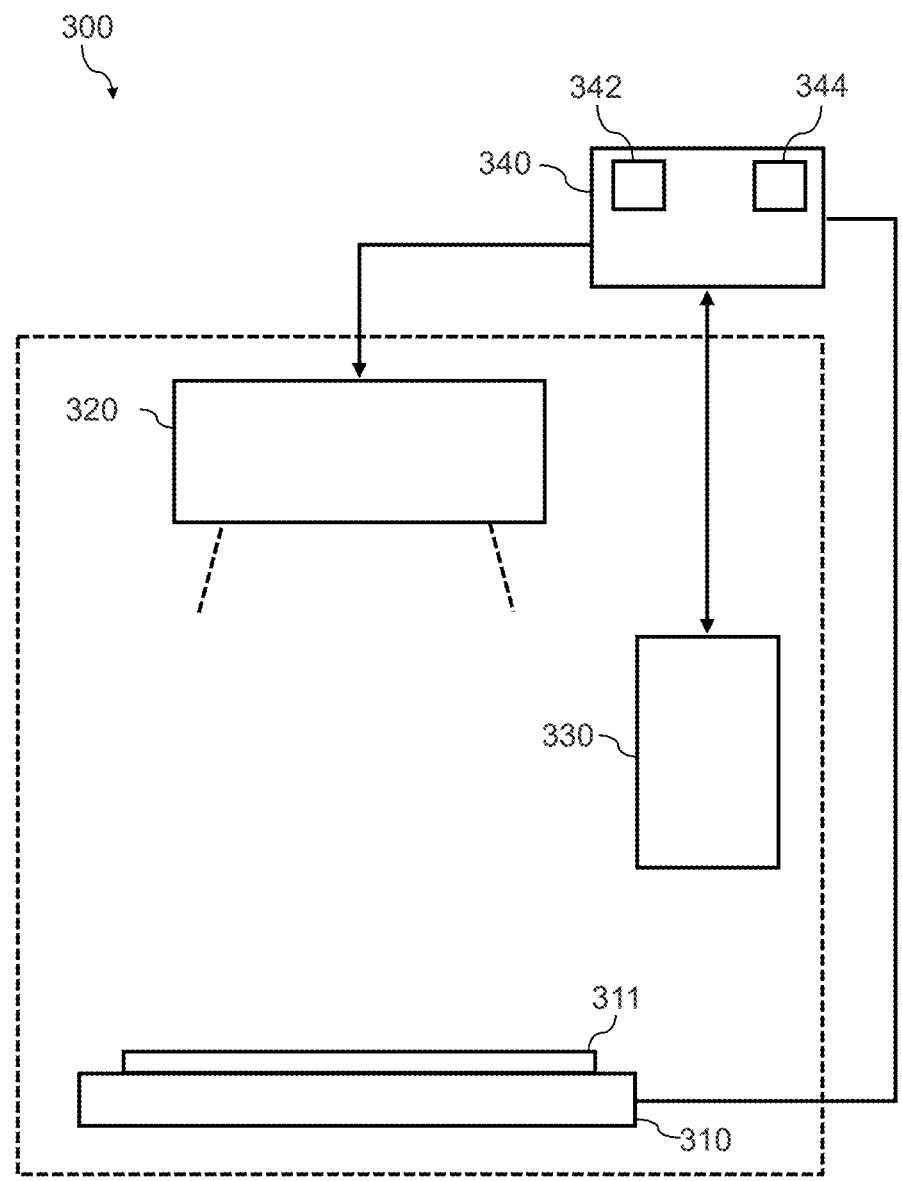
FIG. 8 depicts an example inspection system according to examples of the present disclosure.

FIG. 8 depicts an example inspection system 300 that can be used to implement systems and methods according to example embodiments of the present disclosure. Those of ordinary skill in the art, using the disclosures provided herein, will understand that the inspection system 300 may include more or fewer components without deviating from the scope of the present disclosure. The inspection system 300 may be configured to implement one or more aspects of the present disclosure, such as the processing operations for inspecting and/or characterizing of semiconductor workpieces described herein for grinding operation (e.g., a grinding operation performed by the grinding system 200 shown in FIG. 7).

The inspection system 300 can include a workpiece support 310 configured to support a semiconductor workpiece 311. The workpiece support may include a chuck (e.g., a vacuum chuck) or other mechanism to secure the semiconductor workpiece 311 during processing by the inspection system 300. Additionally or alternatively, in some implementations, the workpiece support 310 may provide a surface on which the semiconductor workpiece 311 rests. In some implementations, the workpiece support 310 may provide for moving, rotating, angling, or otherwise reorienting the workpiece 311 relative to the inspection system 300. In some examples, the inspection system 300 may include a workpiece handling robot operable to move the workpiece to the workpiece support 310.

The inspection system 300 can include one or more imaging devices 320. The imaging device(s) 320 can obtain images from the surface of the semiconductor workpiece 311. The images may have a resolution, which may be dependent in part on a resolution of the imaging device(s) 320. For example, the resolution may have approximately 1 microns per pixel to about 10 microns per pixel. However, in some examples, the resolution may be less than 1 micron per pixel. The imaging device(s) 320 may include any suitable imaging device, such as a PL microscope, x-ray topographic imaging source, cross-polarized light imaging source, camera, infrared camera, camera associated with non-visible light wavelengths, scanning electron microscope, or other suitable device configured to obtain data associated with spatial coordinates of the semiconductor workpiece.

In some embodiments, the inspection system 300 may additionally include one or more sensors 330 for obtaining data indication of one or more workpiece processing parameters the semiconductor workpiece 311, such as workpiece processing parameter for the semiconductor workpiece 311. Workpiece processing parameter data is data that provides information associated with the semiconductor workpiece 311, such as topography, roughness, presence of anomalies, doping, thickness, and/or other characteristics. Workpiece processing parameter data may include, for instance, an image of the surface of the workpiece 311 and/or a topological map of the surface of the workpiece 311. In some embodiments, the one or more sensors 330 may include one or more surface measurement lasers that may be operable to emit a laser onto the surface of the workpiece 311 and scan the surface (based on reflections of the laser) for depth measurements, topography measurements, etc. of the surface of the workpiece 1011. Other suitable sensors may be used without deviating from the scope of the present disclosure.

The inspection system 300 includes one or more control devices, such as control circuitry 340. In some examples, the control circuitry 340 may include one or more controllers or computing devices that, in turn, include one or more processors 342 and one or more memory devices 344. The one or more memory devices 344 may store computer-readable instructions that when executed by the one or more processors 342 cause the one or more processors 342 to perform one or more control functions, such as any of the functions described herein. The control circuitry 340 may be in communication with various other aspects of the inspection system 300 through one or more wired and/or wireless control links. The control circuitry 340 may send control signals to the various components of the inspection system 300 (e.g., the the workpiece support 310, the imaging device(s) 320, the sensor(s) 330, etc.) to implement the aspects of the present disclosure described herein. Additionally, the control circuitry 340 may include one or more inspection models, such as one or more machine-learned models (e.g., a machine-learned encoding model, autoencoder, etc.) for inspecting and/or characterizing of semiconductor workpieces, as described herein. As one example, the control circuitry 340 may be at least a portion of the computing system 500 of FIG. 10 (e.g., the computing system 502 and/or the training computing system 550).

Figure 9:
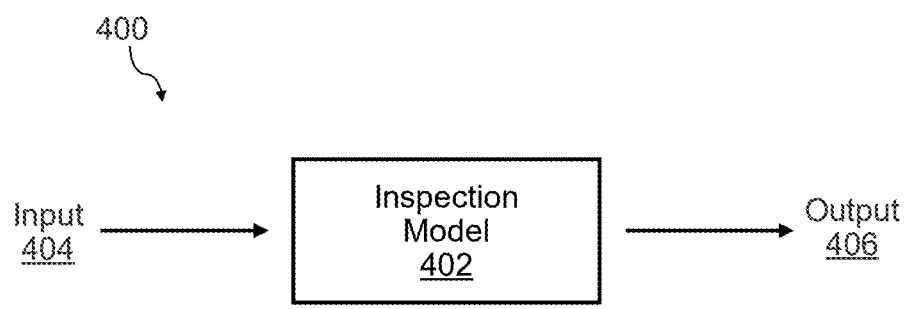
FIG. 9 depicts an example inspection model according to examples of the present disclosure.

FIG. 9 depicts an example inspection model 400 according to example aspects of the present disclosure. In general, the inspection model 400 may implemented by a suitable computing system (e.g., the control circuitry 260 of the grinding system 200, the control circuitry 340 of the inspection system 300, and/or the computing system 502 and/or the training computing system 550 shown in FIG. 10) to process images (e.g., captured by the imaging device(s) 320) and provide an output indicative of, for instance, grind depth, such as an additional grind depth. Specifically, the inspection model 400 can be configured to receive input 404 and, in response to receipt of input 404, produce an output 406. According to example aspects of the present disclosure, the input 404 can include one or more images captured as part of obtaining the data indicative of the one or more workpiece process parameters. The output 406 can be indicative of an additional grind depth for the workpiece 311. In some examples, the inspection model 400 can be a machine-learned model 402, such as a neural network (e.g., a convolutional neural network). In this respect, the machine-learned model 402 is trained to provide the output 406 based at least in part on pixel values within the image(s) received as the input 404.

The output 406 can be any suitable grinding depth or associated parameter for a semiconductor workpiece. In some examples, the output 406 can be a grinding depth for a first semiconductor workpiece, such as the current semiconductor workpiece on which a grinding operation is to be performed. In such examples, the output 406 can be the grinding depth for the first semiconductor workpiece when no grinding operation has yet to been performed (e.g., the total grinding depth). Alternatively, in such examples, the output 406 can be an additional grinding depth for the first semiconductor workpiece after an initial grinding operation has been performed thereon. In some examples, the output 406 can be a grinding depth for a second semiconductor workpiece (e.g., a semiconductor workpiece to have a grinding operation performed thereon after the first semiconductor workpiece).

FIGS. 10A-F depict example images of a surface of a semiconductor workpiece during the performance of a grinding operation according to examples of the present disclosure. In accordance with some example aspects of the present disclosure, the example images depicted in FIGS. 10A-F can be used to train a model, such as the inspection model 400 described above with respect to FIG. 9. In some examples, the example images depicted in FIGS. 10A-F may be used as input 404 to the inspection model 400 to be processed and provide an output (e.g., output 406 of FIG. 9).

Figure 10A:
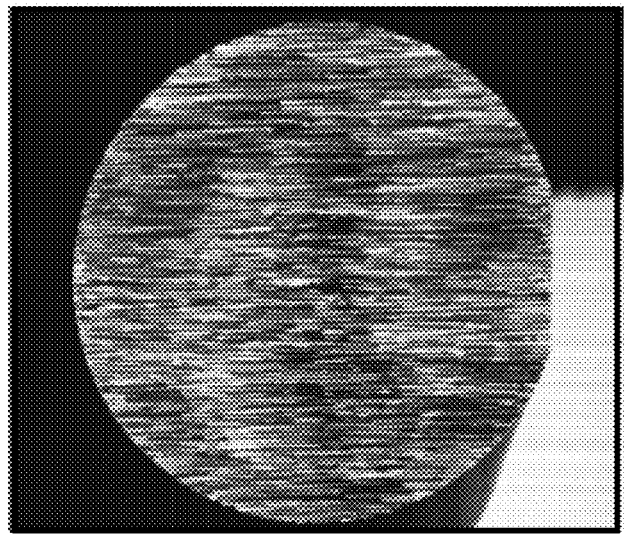
FIGS. 10A-10F depict example images of a surface of a semiconductor workpiece during the performance of a grinding operation according to examples of the present disclosure.
Figure 10B:
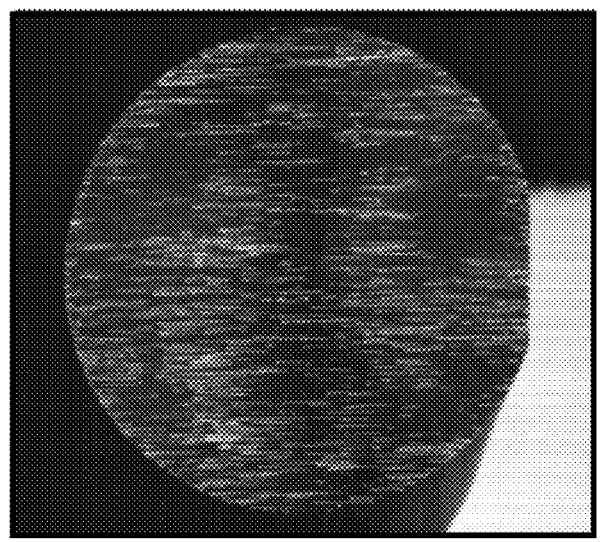
Figure 10C:
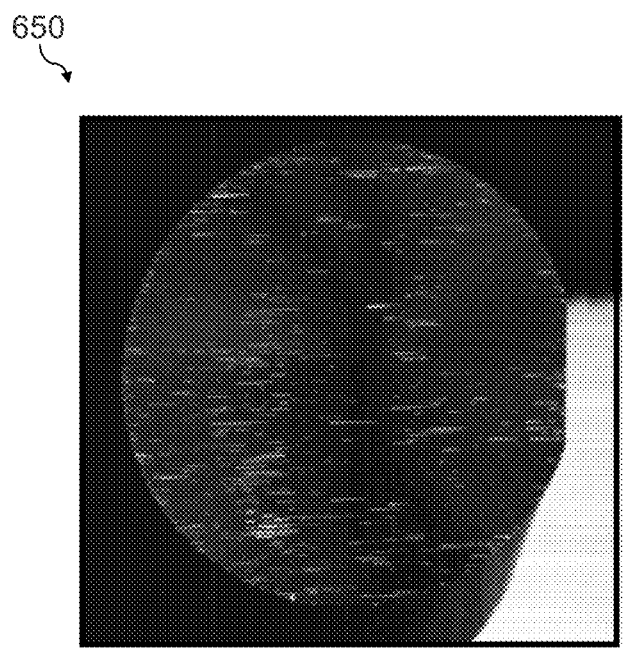
Figure 10D:
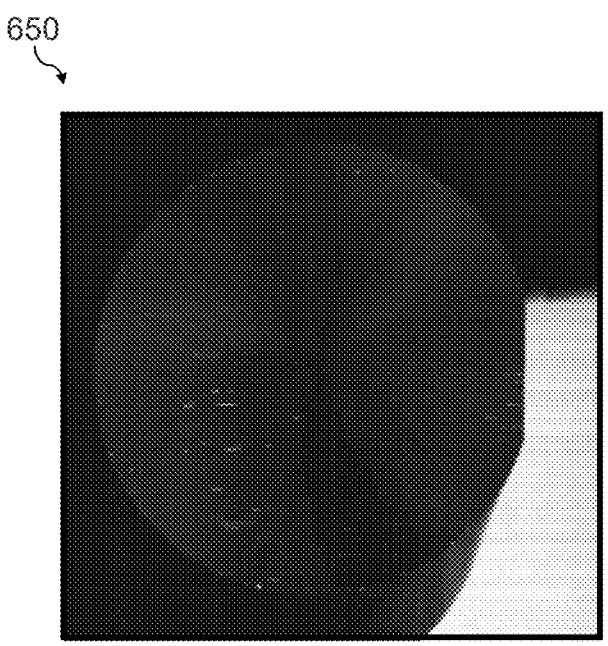
Figure 10E:
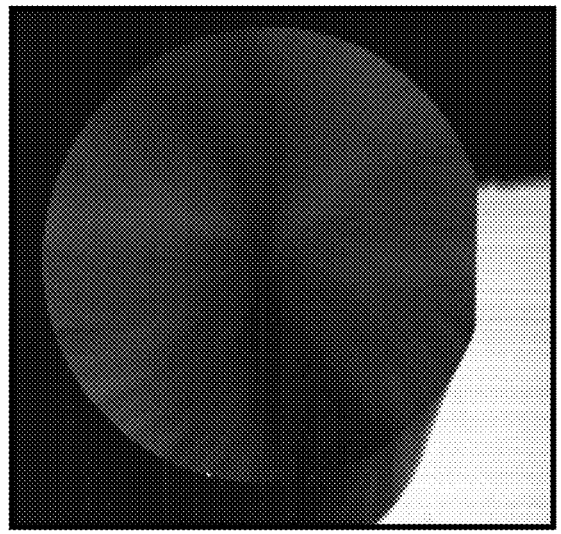
Figure 10F:
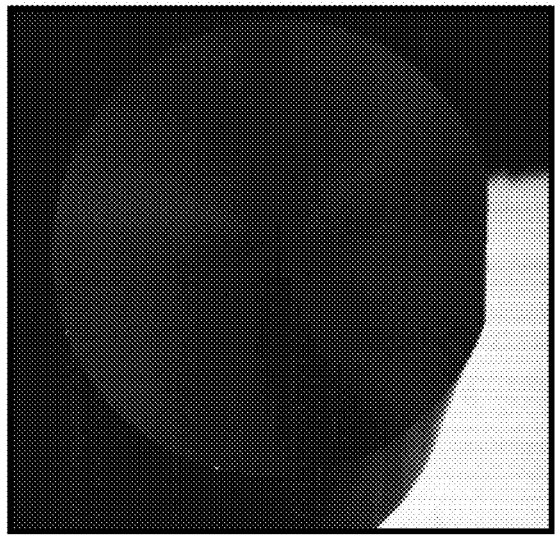

For example, FIG. 10A depicts an example of a surface of a semiconductor workpiece 650 after a grinding operation is performed to remove material from the surface to a first grinding depth (e.g., about 25 microns). For instance, based on the image of FIG. 10A, the inspection model 400 can provide an output indicative of a high additional grind depth (e.g., an additional grind depth 35 microns) to achieve a semiconductor workpiece that is similar to the image shown in FIG. 10F. FIG. 10B depicts an example of a surface of the semiconductor workpiece 650 after the grinding operation is performed to remove additional material from the surface to a second grinding depth (e.g., about 32 microns). For instance, based on the image of FIG. 10B, the inspection model 400 can provide a lesser additional grind depth (e.g., an additional grind depth 28 microns) to achieve a semiconductor workpiece that is similar to the image shown in FIG. 10F than is required for the image shown in FIG. 10A. FIG. 10C depicts an example of a surface of the semiconductor workpiece 650 after the grinding operation is performed to remove additional material from the surface to a third grinding depth (e.g., about 39 microns). For instance, based on the image of FIG. 10C, the inspection model 400 can provide an output indicative of a lesser additional grind depth (e.g., an additional grind depth 21 microns) to achieve a semiconductor workpiece that is similar to the image shown in FIG. 10F than is required for the image shown in FIG. 10B. FIG. 10D depicts an example of a surface of the semiconductor workpiece 650 after the grinding operation is performed to remove additional material from the surface to a fourth grinding depth (e.g., about 46 microns). For instance, based on the image of FIG. 10D, the inspection model 400 can provide an output indicative of a lesser additional grind depth (e.g., an additional grind depth 14 microns) to achieve a semiconductor workpiece that is similar to the image shown in FIG. 10F than is required for the image shown in FIG. 10C. FIG. 10E depicts an example of a surface of the semiconductor workpiece 650 after the grinding operation is performed to remove additional material from the surface to a fifth grinding depth (e.g., about 53 microns). For instance, based on the image of FIG. 10E, the inspection model 400 can provide an output indicative of a lesser additional grind depth (e.g., an additional grind depth 7 microns) to achieve a semiconductor workpiece that is similar to the image shown in FIG. 10F than is required for the image shown in FIG. 10D. FIG. 10F depicts an example of a surface of the semiconductor workpiece 650 after the grinding operation is performed to remove additional material from the surface to a sixth grinding depth (e.g., about 59 microns). For instance, based on the image of FIG. 10F, the inspection model 400 can provide an output indicative of no additional grind depth.

Figure 11:
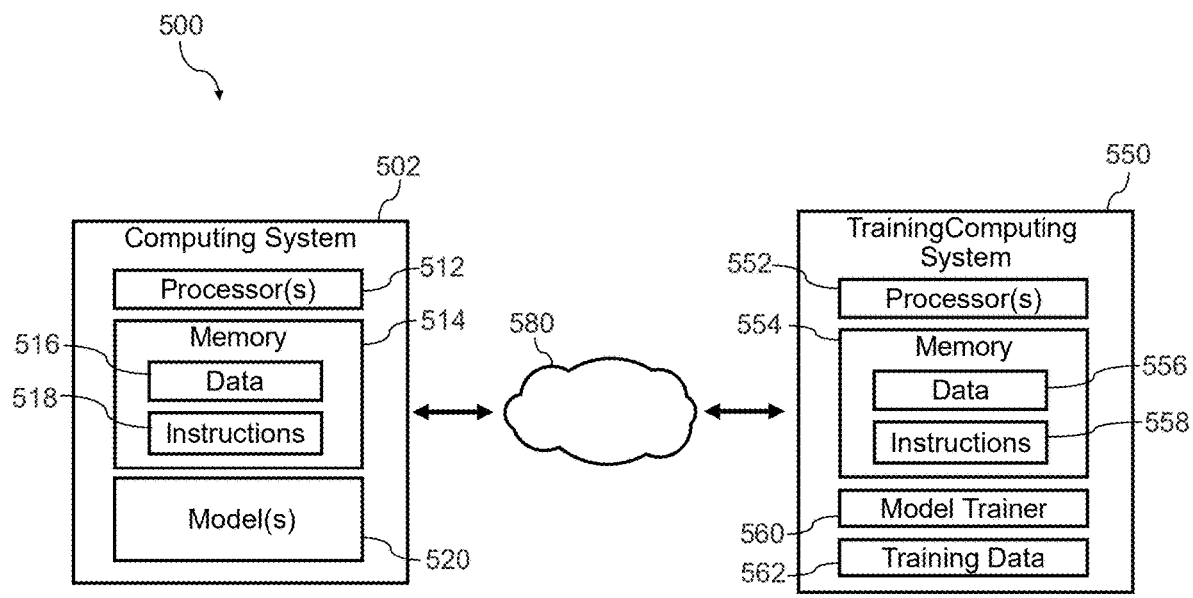
FIG. 11 depicts a block diagram of an example computing system that can be used to implement systems and methods according to examples of the present disclosure.

FIG. 11 depicts a block diagram of an example computing system 500 that can be used to implement systems and methods according to example embodiments of the present disclosure, such as the model 400. The system 500 includes a computing system 502 and a training computing system 550 that are communicatively coupled over a network 580.

The computing system 502 can include any type of computing device (e.g., classical and/or quantum computing device). The computing system 502 includes one or more processors 512 and a memory 514. The one or more processors 512 can be any suitable processing device (e.g., a processor core, a microprocessor, CPU, GPU, an ASIC, a FPGA, control circuitry, a microcontroller, etc.) and can be one processor or a plurality of processors that are operatively connected. The memory 514 can include one or more non-transitory computer-readable storage mediums, such as RAM, ROM, EEPROM, EPROM, flash memory devices, magnetic disks, etc., and combinations thereof. The memory 514 can store data 516 (e.g., parameters, input data, etc.) and instructions 518 which are executed by the processor 512 to cause the computing system 502 to perform operations. In some implementations, the computing system 502 can store or include one or more machine-learned models 520 (e.g., autoencoders, machine-learned encoding models, etc.), such as the machine-learned model 402, as described herein.

The computing system 502 can train the machine-learned model(s) 520, such as the machine-learned model 402, via interaction with the training computing system 550 that is communicatively coupled over the network 580. The training computing system 550 can be separate from the computing system 502 or can be a portion of the computing system 502.

The training computing system 550 includes one or more processors 552 and a memory 554. The one or more processors 552 can be any suitable processing device (e.g., a processor core, a microprocessor, CPU, GPU, an ASIC, a FPGA, control circuitry, a microcontroller, etc.) and can be one processor or a plurality of processors that are operatively connected. The memory 554 can include one or more non-transitory computer-readable storage mediums, such as RAM, ROM, EEPROM, EPROM, flash memory devices, magnetic disks, etc., and combinations thereof. The memory 554 can store data 556 and instructions 558 which are executed by the processor 552 to cause the training computing system 550 to perform operations. In some implementations, the training computing system 550 includes or is otherwise implemented by one or more server computing devices.

The training computing system 550 can include a model trainer 560 that trains the machine-learned model(s) 520 using various training or learning techniques, such as, for example, backwards propagation of errors. In some implementations, performing backwards propagation of errors can include performing truncated backpropagation through time. The model trainer 560 can perform a number of generalization techniques (e.g., weight decays, dropouts, etc.) to improve the generalization capability of the models being trained.

In particular, the model trainer 560 can train the machine-learned model(s) 520 based at least in part on a set of training data 562. The training data 562 can include, for example, input data corresponding to a plurality of semiconductor workpieces, such as workpiece images, downsampled workpiece images, residual images, crop coordinates, and/or additional inputs.

The model trainer 560 includes computer logic utilized to provide the desired functionality. The model trainer 560 can be implemented in hardware, firmware, and/or software controlling a general-purpose processor. For example, in some implementations, the model trainer 560 includes program files stored on a storage device, loaded into a memory and executed by one or more processors. In other implementations, the model trainer 560 includes one or more sets of computer-executable instructions that are stored in a tangible computer-readable storage medium such as RAM hard disk or optical or magnetic media.

The network 580 can be any type of communications network, such as a local area network (e.g., intranet), wide area network (e.g., Internet), or some combination thereof, and can include any number of wired or wireless links. In general, communication over the network 580 can be carried via any type of wired and/or wireless connection, using a wide variety of communication protocols (e.g., TCP/IP, HTTP, SMTP, FTP), encodings or formats (e.g., HTML, XML), and/or protection schemes (e.g., VPN, secure HTTP, SSL).

FIG. 11 illustrates an example computing system that can be used to implement example aspects of the present disclosure. Other computing systems can be used as well. For example, in some implementations, the computing system 502 can include the model trainer 560 and the training dataset 562. In such implementations, the model(s) 520 can be both trained and used locally at the computing system 502.

Figure 12:
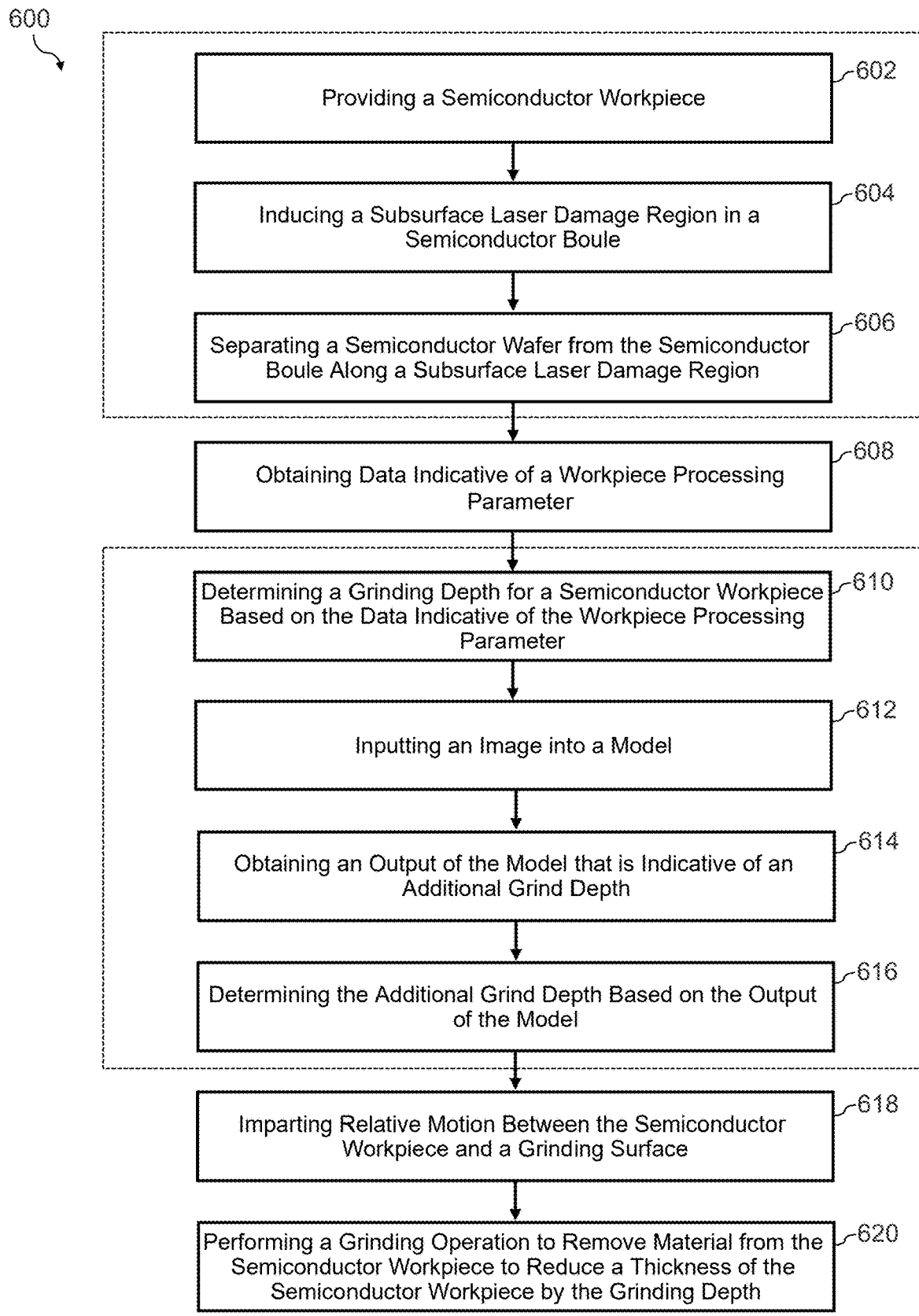
FIG. 12 depicts a flow chart diagram of an example method according to examples of the present disclosure.

FIG. 12 depicts a flow chart diagram of an example method 600 according to example aspects of the present disclosure. The method 600 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 602, the method 600 includes providing a semiconductor workpiece. In some examples, the semiconductor workpiece is a wide bandgap semiconductor workpiece, such as a silicon carbide or Group-III nitride workpiece. In some examples, the semiconductor workpiece may be a semiconductor boule or a semiconductor wafer. For example, the semiconductor wafer may be removed from the semiconductor boule using a removal process.

As shown in FIG. 12, the removal process may include, for example, at 604, inducing a subsurface laser damage region in the semiconductor boule. In some instances, the subsurface laser damage may be induced in the semiconductor boule using one or more lasers. The removal process may additionally include, for example, at 606 separating the semiconductor wafer from the semiconductor boule along the subsurface laser damage region. A variety of separation methods may be used to separate the wide bandgap semiconductor wafer from the semiconductor boule.

Aspects of the present disclosure are discussed with reference to a laser-based removal process for separating the semiconductor wafer from the boule for purposes of illustration and discussion. Those of ordinary skill in the art, using the disclosures provided herein, will understand that aspects of the present disclosure are depicted to any removal process for separating the semiconductor wafer from the boule (e.g., a wire saw-based removal, an implant-based removal processes, etc.) without deviating from the scope of the present disclosure.

At 608, the method 600 includes obtaining data indicative of a workpiece processing parameter. For instance, the workpiece processing parameter data may be obtained from one or more sensors. In some embodiments, the workpiece processing parameter data may be obtained by scanning the surface of the semiconductor workpiece with one or more surface measurement lasers. In some embodiments, the workpiece processing parameter data may be obtained from an optical sensor or image-capturing device (e.g., camera) and processing or analyzing the images (e.g., using digital image process techniques, models such as machine-learned models, etc.) obtained from the optical sensor or image-capturing device. The workpiece processing parameter data may be obtained in a variety of formats without deviating from the scope of the present disclosure.

At 610, the method 600 includes determining a grinding depth for a semiconductor workpiece based at least in part on the data indicative of the workpiece processing parameter. For instance, the method can include determining the grinding depth based at least in part on one or more workpiece processing parameters, such as one or more wafer removal parameters (e.g., at least one of a wafer separation type, a laser power, a position of the semiconductor wafer within a semiconductor boule, or a material type of the semiconductor wafer), one or more grinding parameters (e.g., at least one of a grinding surface wear, a grinding surface medium, or a grinding surface speed), and/or the like.

In some examples, at 610, the grinding depth is determined based at least in part on one or more images of the surface of the semiconductor workpiece on which the grinding operation is to be performed. For instance, the method may include, at 612, inputting the image(s) into a model, such as an inspection model. In some implementations, the model is a machine-learned model, such as a machine-learned model (e.g., a neural network) trained to provide the output based at least in part on the image(s). At 614, the method may include obtaining an output of the model that is indicative of an additional grind depth. Thereafter, at 616, the method may include determining the additional grind depth based at least in part on the output of the model. The additional grind depth may, in turn, the additional amount of material that needs to be removed from the surface of the semiconductor workpiece to remove any damage based at least in part on the image.

At 618, the method 600 includes imparting relative motion between the semiconductor workpiece and a grinding surface. In some instances, imparting relative motion may be performed during other operations of the method 600. For example, imparting relative motion between the semiconductor workpiece and the grinding surface may be performed during the operation 620 described below. As an example, imparting relative motion between the semiconductor workpiece and the grinding surface may result in at least 85% of the surface of the semiconductor workpiece, such as at least 95% of the surface of the semiconductor workpiece, such as at least 99% of the surface of the semiconductor workpiece being contacted by the grinding surface. In some instances, imparting relative motion between the semiconductor workpiece and the grinding surface may include moving the semiconductor workpiece relative to the grinding surface. The inverse may also be true. In some instances, the grinding surface may be moved relative to the semiconductor workpiece.

At 620, the method 600 includes performing a grinding operation to remove material from the semiconductor workpiece to reduce a thickness of the semiconductor workpiece by the grinding depth. For example, a grinding system may be controlled based at least in part on the grinding depth to perform the grinding operation as described in the present disclosure.

Figure 13:
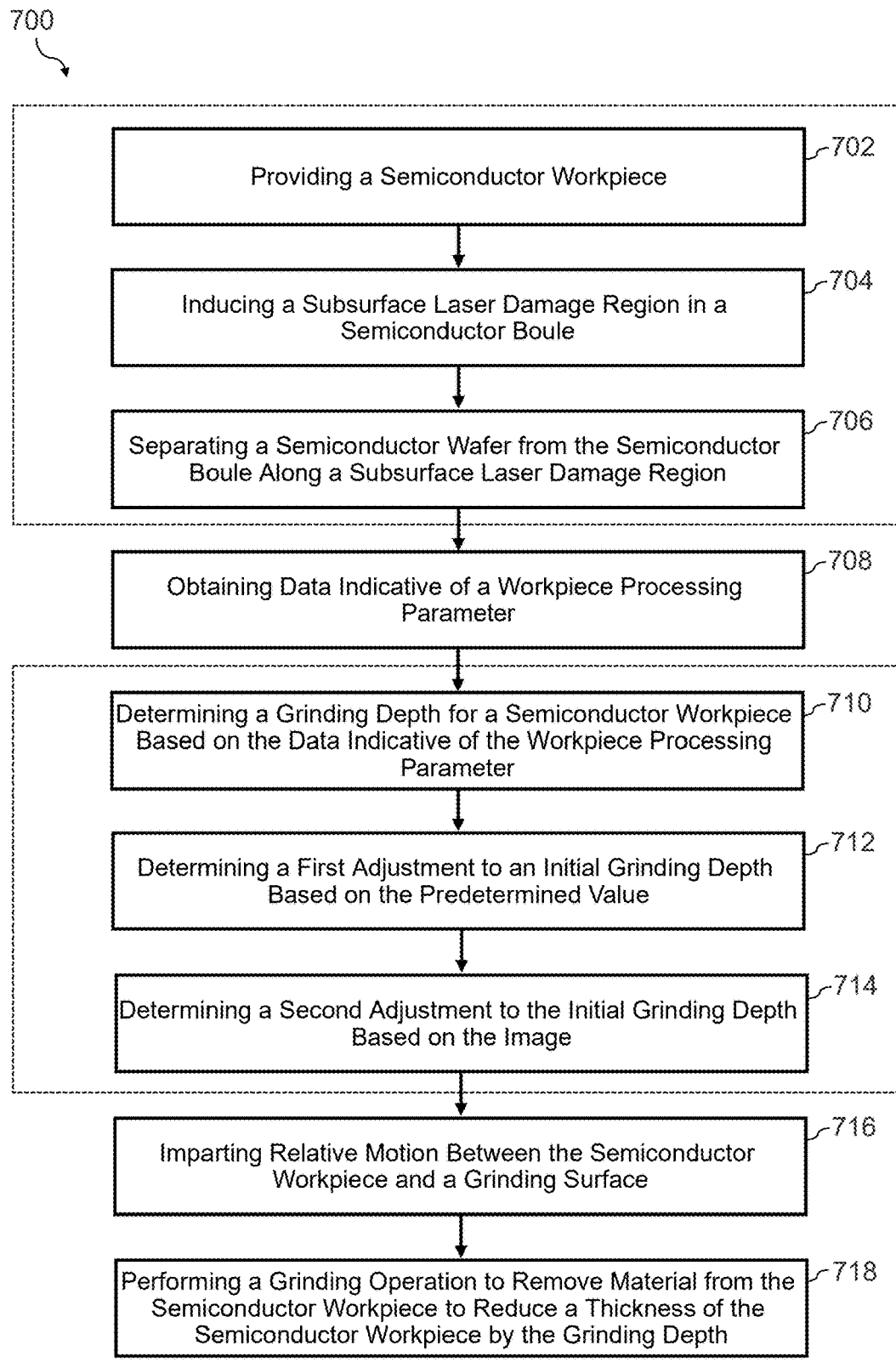
FIG. 13 depicts a flow chart diagram of an example method according to examples of the present disclosure.

FIG. 13 depicts a flow chart diagram of an example method 700 according to example aspects of the present disclosure. The method 700 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 702, the method 700 includes providing a semiconductor workpiece. In some examples, the semiconductor workpiece is a wide bandgap semiconductor workpiece, such as a silicon carbide or Group-III nitride workpiece. In some examples, the semiconductor workpiece may be a semiconductor boule or a semiconductor wafer. For example, the semiconductor wafer may be removed from the semiconductor boule using a removal process.

As shown in FIG. 13, the removal process may include, for example, at 704, inducing a subsurface laser damage region in the semiconductor boule. In some instances, the subsurface laser damage may be induced in the semiconductor boule using one or more lasers. The removal process may additionally include, for example, at 706 separating the semiconductor wafer from the semiconductor boule along the subsurface laser damage region. A variety of separation methods may be used to separate the wide bandgap semiconductor wafer from the semiconductor boule.

Aspects of the present disclosure are discussed with reference to a laser-based removal process for separating the semiconductor wafer from the boule for purposes of illustration and discussion. Those of ordinary skill in the art, using the disclosures provided herein, will understand that aspects of the present disclosure are depicted to any removal process for separating the semiconductor wafer from the boule (e.g., a wire saw-based removal, an implant-based removal processes, etc.) without deviating from the scope of the present disclosure At 708, the method 700 includes obtaining data indicative of a workpiece processing parameter. For instance, the workpiece processing parameter data may be obtained from one or more sensors. In some embodiments, the workpiece processing parameter data may be obtained by scanning the surface of the semiconductor workpiece with one or more surface measurement lasers. In some embodiments, the workpiece processing parameter data may be obtained from an optical sensor or image-capturing device (e.g., camera) and processing or analyzing the images (e.g., using digital image process techniques, models such as machine-learned models, etc.) obtained from the optical sensor or image-capturing device. Additionally, the workpiece processing parameter data may be obtained from an operator of the system, such as when the workpiece processing parameter(s) is one or more preset or predetermined values. The predetermined value(s) can, in turn, be a parameter value that is preset or otherwise predetermined, e.g., by the operator. For example, the operator can input or otherwise provide (e.g., via a suitable user interface) one or more workpiece processing parameters, such as one or more wafer removal parameters and/or one or more grinding parameters.

At 710, the method 700 includes determining a grinding depth for a semiconductor workpiece based at least in part on the data indicative of the workpiece processing parameter. For instance, the method can include determining the grinding depth based at least in part on one or more workpiece processing parameters, such as one or more wafer removal parameters (e.g., at least one of a wafer separation type, a laser power, a position of the semiconductor wafer within a semiconductor boule, or a material type of the semiconductor wafer), one or more grinding parameters (e.g., at least one of a grinding surface wear, a grinding surface medium, or a grinding surface speed), and/or the like.

In some examples, at 710, the grinding depth is determined based at least in part on a combination of one or more predetermined values and one or more images. For instance, the method may include, at 712, determining a first adjustment to the grinding depth based at least in part on the predetermined value(s). At 714, the method may include determining a second adjustment to the grinding depth based at least in part on the image (e.g., using the model as described above with reference to 610 of the method 600). The first and second adjustments may collectively constitute additional grind depth.

At 716, the method 600 includes imparting relative motion between the semiconductor workpiece and a grinding surface. In some instances, imparting relative motion may be performed during other operations of the method 700. For example, imparting relative motion between the semiconductor workpiece and the grinding surface may be performed during the operation 718 described below. As an example, imparting relative motion between the semiconductor workpiece and the grinding surface may result in at least 85% of the surface of the semiconductor workpiece, such as at least 95% of the surface of the semiconductor workpiece, such as at least 99% of the surface of the semiconductor workpiece being contacted by the grinding surface. In some instances, imparting relative motion between the semiconductor workpiece and the grinding surface may include moving the semiconductor workpiece relative to the grinding surface. The inverse may also be true. In some instances, the grinding surface may be moved relative to the semiconductor workpiece.

At 718, the method 700 includes performing a grinding operation to remove material from the semiconductor workpiece to reduce a thickness of the semiconductor workpiece by the grinding depth. For example, a grinding system may be controlled based at least in part on the grinding depth to perform the grinding operation as described in the present disclosure.

Figure 14:
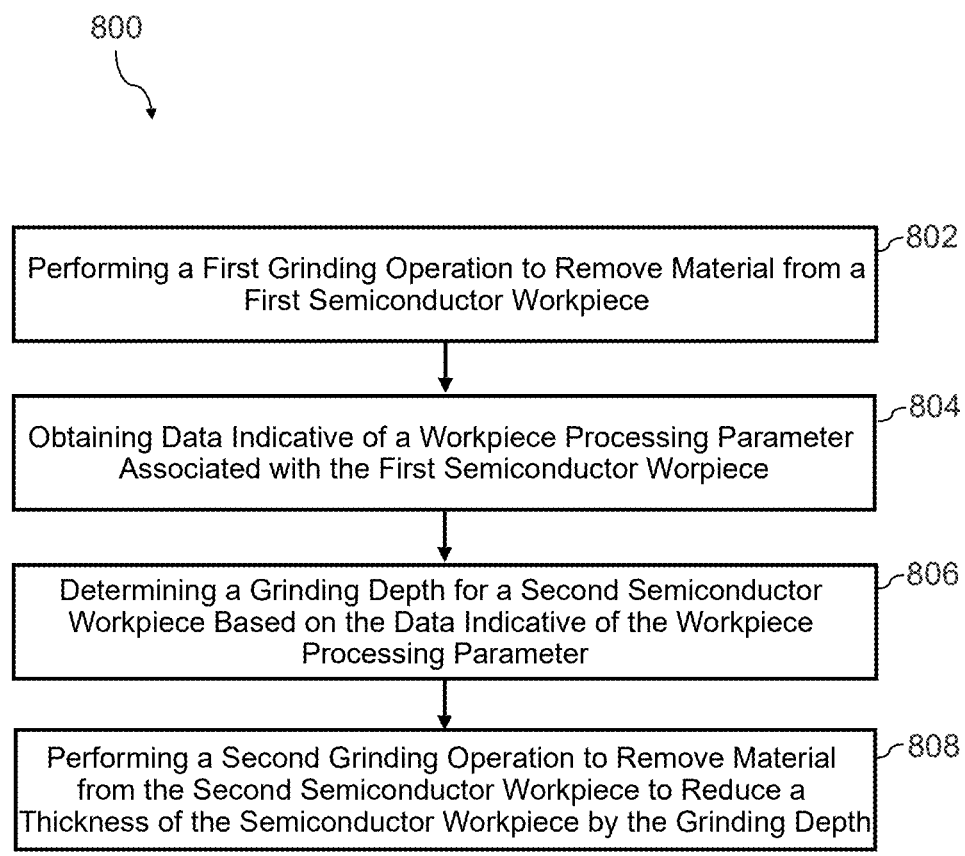
FIG. 14 depicts a flow chart diagram of an example method according to examples of the present disclosure.

FIG. 14 depicts a flow chart diagram of an example method 800 according to example aspects of the present disclosure. The method 800 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 802, the method 800 includes performing a first grinding operation to remove material from a first semiconductor workpiece. For instance, the grinding surface of a grinding system may be controlled to perform a grind operation on the first semiconductor workpiece.

At 804, the method 800 includes obtaining data indicative of a workpiece processing parameter associated with the first semiconductor workpiece. For instance, the workpiece processing parameter data may be obtained from one or more sensors. In some embodiments, the workpiece processing parameter data may be obtained by scanning the surface of the semiconductor workpiece with one or more surface measurement lasers. In some embodiments, the workpiece processing parameter data may be obtained from an optical sensor or image-capturing device (e.g., camera) and processing or analyzing the images (e.g., using digital image process techniques, models such as machine-learned models, etc.) obtained from the optical sensor or image-capturing device. The workpiece processing parameter data may be obtained in a variety of formats without deviating from the scope of the present disclosure.

At 806, the method 800 includes determining a grinding depth for a second semiconductor workpiece based at least in part on the data indicative of the workpiece processing parameter. For instance, the method can include determining the grinding depth based at least in part on one or more workpiece processing parameters, such as one or more wafer removal parameters (e.g., at least one of a wafer separation type, a laser power, a position of the semiconductor wafer within a semiconductor boule, or a material type of the semiconductor wafer), one or more grinding parameters (e.g., at least one of a grinding surface wear, a grinding surface medium, or a grinding surface speed), and/or the like. In some examples, the grinding depth may be determined based at least in part on an image of the first semiconductor workpiece. Thus, in method 800, the grinding depth for one semiconductor workpiece (i.e., the second semiconductor workpiece) is determined based at least in part on data from another semiconductor workpiece (i.e., the first semiconductor workpiece).

At (808), the method 800 includes performing a second grinding operation to remove material from the semiconductor workpiece to reduce a thickness of the semiconductor workpiece by the grinding depth. For instance, the grinding surface of the grinding system may be controlled to perform a second grind operation on the second semiconductor workpiece. Thus, the grinding operation described above with reference to FIG. 8 corresponds to the second grinding operation.

Figure 15:
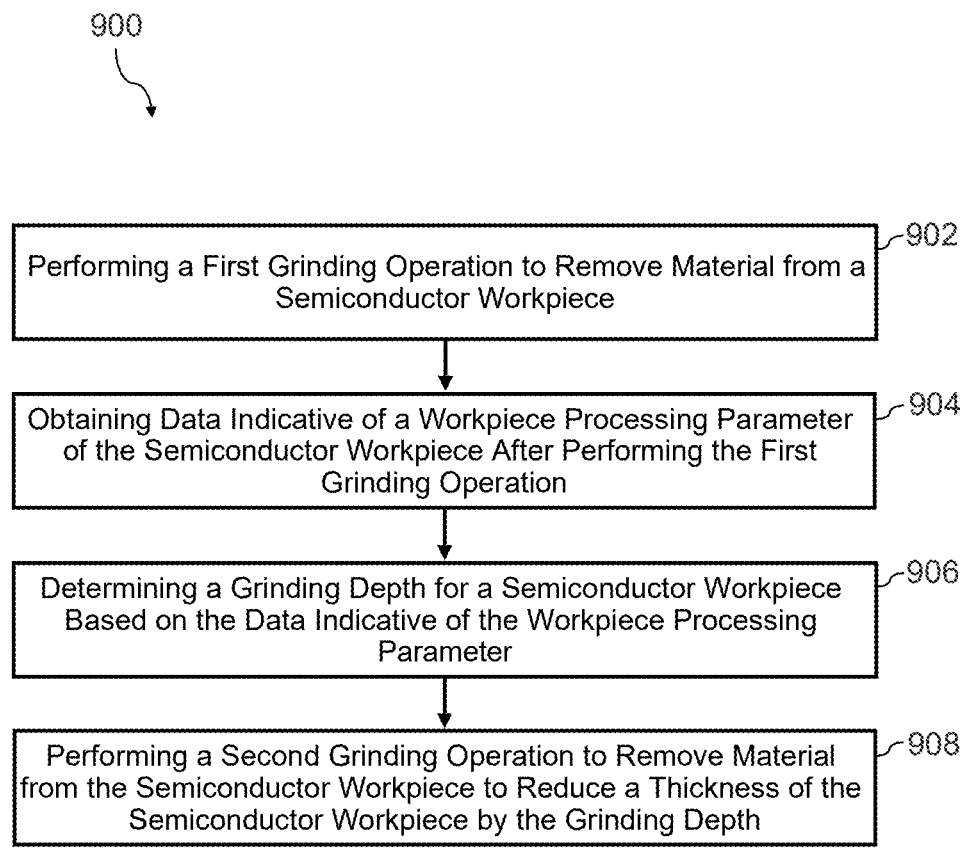
FIG. 15 depicts a flow chart diagram of an example method according to examples of the present disclosure.

FIG. 15 depicts a flow chart diagram of an example method 900 according to example aspects of the present disclosure. The method 900 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 902, the method 900 includes performing a first grinding operation to remove material from a semiconductor workpiece. For instance, the grinding surface of a grinding system may be controlled to perform a first grind operation on the semiconductor workpiece.

At 904, the method 900 includes obtaining data indicative of a workpiece processing parameter associated with the semiconductor workpiece. For instance, the workpiece processing parameter data may be obtained from one or more sensors. In some embodiments, the workpiece processing parameter data may be obtained by scanning the surface of the semiconductor workpiece with one or more surface measurement lasers. In some embodiments, the workpiece processing parameter data may be obtained from an optical sensor or image-capturing device (e.g., camera) and processing or analyzing the images (e.g., using digital image process techniques, models such as machine-learned models, etc.) obtained from the optical sensor or image-capturing device. The workpiece processing parameter data may be obtained in a variety of formats without deviating from the scope of the present disclosure.

At 906, the method 900 includes determining a grinding depth for the semiconductor workpiece based at least in part on the data indicative of the workpiece processing parameter. For instance, the method can include determining the grinding depth based at least in part on one or more workpiece processing parameters, such as one or more wafer removal parameters (e.g., at least one of a wafer separation type, a laser power, a position of the semiconductor wafer within a semiconductor boule, or a material type of the semiconductor wafer), one or more grinding parameters (e.g., at least one of a grinding surface wear, a grinding surface medium, or a grinding surface speed), and/or the like. In some examples, the grinding depth may be determined based at least in part on an image of the semiconductor workpiece. Thus, in method 800, the grinding depth for the semiconductor workpiece is determined based at least in part on data obtained after an initial grinding operation was performed on that same semiconductor workpiece.

At (908), the method 900 includes performing a second grinding operation to remove material from the semiconductor workpiece to reduce a thickness of the semiconductor workpiece by the grinding depth. For instance, the grinding surface of the grinding system may be controlled to perform a second grind operation on the semiconductor workpiece. Thus, the grinding operation described above with reference to FIG. 15 corresponds to the second grinding operation.

Example aspects of the present disclosure are set forth below. Any of the below features or examples may be used in combination with any of the embodiments or features provided in the present disclosure.

In an aspect, the present disclosure provides a method. In some implementations, the example method includes obtaining data indicative of a workpiece processing parameter. In some implementations, the example method includes determining a grinding depth for a semiconductor workpiece based at least in part on the data indicative of the workpiece processing parameter. In some implementations, the example method includes performing a grinding operation to remove material from the semiconductor workpiece to reduce a thickness of the semiconductor workpiece by the grinding depth.

In some implementations of the example method, the semiconductor workpiece is a semiconductor wafer.

In some implementations of the example method, the workpiece processing parameter includes a wafer removal parameter.

In some implementations of the example method, the wafer removal parameter includes at least one of a wafer separation type, a laser power, a position of the semiconductor wafer within a semiconductor boule, or a material type of the semiconductor wafer.

In some implementations of the example method, the workpiece processing parameter includes a grinding parameter, the grinding parameter comprises at least one of a grinding surface wear, a grinding surface medium, or a grinding surface speed.

In some implementations of the example method, the semiconductor workpiece is a semiconductor boule.

In some implementations of the example method, the data indicative of the workpiece processing parameter includes an image.

In some implementations of the example method, determining the grinding depth for the semiconductor workpiece includes inputting the image into a model and obtaining an output of the model that is indicative of an additional grind depth.

In some implementations of the example method, determining the grinding depth for the semiconductor workpiece further includes determining the additional grind depth based at least in part on the output of the model.

In some implementations of the example method, the model is a machine-learned model.

In some implementations of the example method, the machine-learned model is trained to provide the output based at least in part on the image.

In some implementations of the example method, the data indicative of the workpiece processing parameter further includes a predetermined value.

In some implementations of the example method, determining the grinding depth for the semiconductor workpiece includes determining a first adjustment to the grinding depth based at least in part on the predetermined value and determining a second adjustment to the grinding depth based at least in part on the image.

In some implementations of the example method, the first adjustment is greater than the second adjustment.

In some implementations of the example method, the data indicative of the workpiece processing parameter includes a surface topological mapping of the surface.

In some implementations of the example method, the data indicative of the workpiece processing parameter is obtained from an optical sensor.

In some implementations of the example method, the data indicative of the workpiece processing parameter is obtained from one or more surface measurement lasers.

In some implementations of the example method, the grinding operation corresponds to a second grinding operation. The example method further includes performing a first grinding operation to remove material from the semiconductor workpiece before obtaining the data indicative of the workpiece processing parameter for the semiconductor workpiece.

In some implementations of the example method, the first grinding operation removes the material from the semiconductor workpiece to reduce the thickness of the semiconductor workpiece by a first depth and the second grinding operation removes the semiconductor material from the semiconductor workpiece to reduce the thickness of the semiconductor workpiece by the grinding depth, the first depth being less than the grinding depth.

In some implementations of the example method, the semiconductor workpiece corresponds to a second semiconductor workpiece. In some implementations, the example method further includes performing a grinding operation to remove material from a first semiconductor workpiece. In some implementations of the example method, obtaining data indicative of the workpiece processing parameter includes obtaining data indicative of a workpiece processing parameter associated with the first semiconductor workpiece.

In some implementations of the example method, performing the grinding operation includes imparting relative motion between the semiconductor workpiece and a grinding surface.

In some implementations, the example method includes removing a portion of a semiconductor boule using a removal process to form the semiconductor workpiece before obtaining the data indicative of the workpiece processing parameter.

In some implementations of the example method, removing the portion of the semiconductor boule using the removal process includes removing a semiconductor wafer from the semiconductor boule using a laser-based removal process.

In some implementations of the example method, the laser-based removal process includes inducing a subsurface laser damage region in the semiconductor boule and separating the semiconductor wafer from the semiconductor boule along the subsurface laser damage region.

In some implementations of the example method, the grinding depth is at least about 25 microns or greater.

In some implementations of the example method, the grinding depth is about 50 microns to about 80 microns.

In some implementations of the example method, the semiconductor workpiece includes a wide bandgap semiconductor.

In some implementations of the example method, the semiconductor workpiece includes silicon carbide.

In some implementations of the example method, the semiconductor workpiece includes a Group III-nitride.

In an aspect, the present disclosure provides an example method for grinding semiconductor wafers. In some implementations, the example method includes obtaining an image of a surface of a semiconductor wafer. In some implementations, the example method includes determining a grinding depth for the semiconductor wafer based at least in part on the image. In some implementations, the example method includes performing a grinding operation to remove material from the semiconductor wafer to reduce a thickness of the semiconductor wafer by the grinding depth.

In some implementations of the example method, determining the grinding depth for the semiconductor wafer includes inputting the image into a model and obtaining an output of the model that is indicative of an additional grind depth.

In some implementations of the example method, determining the grinding depth for the semiconductor wafer further includes determining the additional grind depth based at least in part on the output of the model.

In some implementations of the example method, the model is a machine-learned model.

In some implementations of the example method, the machine-learned model is trained to provide the output based at least in part on pixel values within the image.

In some implementations of the example method, the grinding operation corresponds to a second grinding operation. In some implementations, the example method further includes performing a first grinding operation to remove material from the semiconductor wafer before obtaining the image.

In some implementations of the example method, the first grinding operation removes the semiconductor material from the semiconductor wafer to reduce the thickness of the semiconductor wafer by a first depth and the second grinding operation removes the semiconductor material from the semiconductor wafer to reduce the thickness of the semiconductor wafer by the grinding depth, the first depth being less than the grinding depth.

In some implementations of the example method, the semiconductor wafer corresponds to a second semiconductor wafer. In some implementations, the example method further includes performing a grinding operation to remove material from a first semiconductor wafer. In some implementations of the example method, obtaining the image includes obtaining an image of a surface of the first semiconductor wafer.

In some implementations of the example method, the grinding depth is at least about 25 microns or greater.

In some implementations of the example method, the grinding depth is about 50 microns to about 80 microns.

In some implementations of the example method, the semiconductor wafer includes a wide bandgap semiconductor.

In some implementations of the example method, the semiconductor workpiece includes silicon carbide.

In some implementations of the example method, the semiconductor workpiece includes a Group III-nitride.

In an aspect, the present disclosure provides an example method for grinding semiconductor workpieces. In some implementations, the example method includes performing a first grinding operation to remove material from a semiconductor workpiece. In some implementations, the example method includes obtaining data indicative of a workpiece processing parameter of the semiconductor workpiece after performing the first grinding operation. In some implementations, the example method includes determining a grinding depth for a semiconductor workpiece based at least in part on the data indicative of the workpiece processing parameter. In some implementations, the example method includes performing a second grinding operation to remove material from the semiconductor workpiece to reduce a thickness of the semiconductor workpiece by the grinding depth.

In some implementations of the example method, the first grinding operation removes the semiconductor material from the semiconductor workpiece to reduce the thickness of the semiconductor workpiece by a first depth and the second grinding operation removes the semiconductor material from the semiconductor workpiece to reduce the thickness of the semiconductor workpiece by the grinding depth, the first depth being less than the grinding depth.

In some implementations of the example method, the semiconductor workpiece is a semiconductor wafer.

In some implementations of the example method, the semiconductor workpiece is a semiconductor boule.

In some implementations of the example method, the grinding depth is at least about 25 microns or greater.

In some implementations of the example method, the grinding depth is about 50 microns to about 80 microns.

In some implementations of the example method, the semiconductor workpiece includes a wide bandgap semiconductor.

In some implementations of the example method, wherein the semiconductor workpiece includes silicon carbide.

In some implementations of the example method, the semiconductor workpiece includes a Group III-nitride.

In an aspect, the present disclosure provides an example method for grinding semiconductor workpieces. In some implementations, the example method includes performing a first grinding operation to remove material from a first semiconductor workpiece. In some implementations, the example method includes obtaining data indicative of a workpiece processing parameter associated with the first semiconductor workpiece. In some implementations, the example method includes determining a grinding depth for a second semiconductor workpiece based at least in part on the data indicative of the workpiece processing parameter. In some implementations, the example method includes performing a second grinding operation to remove material from the semiconductor workpiece to reduce a thickness of the semiconductor workpiece by the grinding depth.

In some implementations of the example method, the semiconductor workpiece is a semiconductor wafer.

In some implementations of the example method, the semiconductor workpiece is a semiconductor boule.

In some implementations of the example method, the grinding depth is at least about 25 microns or greater.

In some implementations of the example method, the grinding depth is about 50 microns to about 80 microns.

In some implementations of the example method, the semiconductor workpiece includes a wide bandgap semiconductor.

In some implementations of the example method, the semiconductor workpiece includes silicon carbide.

In some implementations of the example method, the semiconductor workpiece comprises a Group III-nitride.

In an aspect, the present disclosure provides an example system for grinding semiconductor workpieces. In some implementations, the example system includes a grinding surface operable to remove semiconductor material from a surface of a semiconductor workpiece. In some implementations, the example system includes a translation stage operable to impart relative motion between the grinding surface and the semiconductor workpiece. In some implementations, the example system includes a sensor operable to obtain data indicative of a workpiece processing parameter. In some implementations, the example system includes control circuitry configured to perform operations. In some implementations of the example system, the operations include determining a grinding depth for a semiconductor workpiece based at least in part on the data indicative of the workpiece processing parameter. In some implementations of the example system, the operations include controlling the grinding surface to remove the semiconductor material from the semiconductor workpiece to reduce a thickness of the semiconductor workpiece by the grinding depth.

In some implementations of the example system, the semiconductor workpiece is a semiconductor wafer.

In some implementations of the example system, the workpiece processing parameter includes a wafer removal parameter.

In some implementations of the example system, the wafer removal parameter includes at least one of a wafer separation type, a laser power, a position of the semiconductor wafer within a semiconductor boule, or a material type of the semiconductor wafer.

In some implementations of the example system, the workpiece processing parameter includes at least one of a grinding surface wear, a grinding surface medium, or a grinding surface speed.

In some implementations of the example system, the semiconductor workpiece is a semiconductor boule.

In some implementations of the example system, the data indicative of the workpiece processing parameter includes an image.

In some implementations of the example system, when determining the grinding depth for the semiconductor workpiece, the operations include inputting the image into a model and obtaining an output of the model that is indicative of an additional grind depth.

In some implementations of the example system, when determining the grinding depth for the semiconductor workpiece, the operations further include determining the additional grind depth based at least in part on the output of the model.

In some implementations of the example system, the model is a machine-learned model.

In some implementations of the example system, the machine-learned model is trained to provide the output based at least in part on pixel values within the image.

In some implementations of the example system, the data indicative of the workpiece processing parameter includes a surface topological mapping of the surface.

In some implementations of the example system, the sensor is an optical sensor.

In some implementations of the example system, the sensor is a surface measurement laser.

In some implementations of the example system, when controlling the grinding surface, the operations include imparting relative motion between the semiconductor workpiece and a grinding surface.

In some implementations of the example system, the grinding depth is at least about 25 microns or greater.

In some implementations of the example system, the grinding depth is about 50 microns to about 80 microns.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method, comprising:
   obtaining data indicative of a workpiece removal parameter, the workpiece removal parameter indicative of processing information used to separate semiconductor workpieces from a boule;
   performing a grinding operation to remove material from a first semiconductor workpiece removed from the boule to reduce a thickness of the first semiconductor workpiece by a first grind depth;
   obtaining an image of the first semiconductor workpiece after the grinding operation; and
   determining, based on the image and the data indicative of the workpiece removal parameter, second grind depth for a second semiconductor workpiece, the second semiconductor workpiece removed from the boule after the first semiconductor workpiece;
   wherein the second grind depth is different than the first grind depth.

2. The method of claim 1, wherein the semiconductor workpiece is a semiconductor wafer.

3. The method of claim 1, wherein the workpiece wafer removal parameter comprises at least one of a wafer separation type, a laser power, a position of the semiconductor wafer within a semiconductor boule, or a material type of the semiconductor wafer.

4. The method of claim 3, wherein the data indicative of the workpiece removal parameter further comprises a predetermined value.

5. The method of claim 4, wherein determining the grinding depth for the semiconductor workpiece comprises:
   determining a first adjustment to the first grinding depth based at least in part on the predetermined value; and
   determining a second adjustment to the first grinding depth based at least in part on a boule image.

6. The method of claim 5, wherein the first adjustment is greater than the second adjustment.

7. The method of claim 1, wherein the first grind depth is determined using a model, the model being a machine-learned model.

8. The method of claim 7, wherein the machine-learned model is trained to provide the output based at least in part on a boule image.

9. The method of claim 1, wherein the first grind depth is less than the second grind depth.

10. A system for grinding semiconductor workpieces, the system comprising:
- a grinding surface operable to remove semiconductor material from a surface of a semiconductor workpiece;
- a translation stage operable to impart relative motion between the grinding surface and the semiconductor workpiece;
- an image-capturing device; and
- control circuitry configured to perform operations, the operations comprising:
  - determining a first grinding depth for a first semiconductor workpiece based at least in part on the data indicative of a workpiece removal parameter, the workpiece removal parameter indicative of processing information used to separate semiconductor workpieces from a boule;
  - controlling the grinding surface to remove the semiconductor material from the first semiconductor workpiece to reduce a thickness of the first semiconductor workpiece by the first grinding depth;
  - obtaining an image of the first semiconductor workpiece after the grinding operation; and
  - determining, based on the image and the data indicative of the workpiece removal parameter, a second grinding depth for a second semiconductor workpiece, the second semiconductor workpiece removed from the boule after the first semiconductor workpiece;
- wherein the second grinding depth is different than the first grinding depth.

* * * * *